US010757503B2

(12) United States Patent
Colich

(10) Patent No.: US 10,757,503 B2
(45) Date of Patent: Aug. 25, 2020

(54) ACTIVE NOISE CONTROL WITH PLANAR TRANSDUCERS

(71) Applicant: Dragoslav Colich, Orange, CA (US)

(72) Inventor: Dragoslav Colich, Orange, CA (US)

(73) Assignee: Audeze, LLC, Santa Ana, CA (US)

( * ) Notice: Subject to any disclaimer, the term of this patent is extended or adjusted under 35 U.S.C. 154(b) by 174 days.

(21) Appl. No.: 15/898,225

(22) Filed: Feb. 15, 2018

(65) Prior Publication Data

US 2018/0255394 A1 Sep. 6, 2018

Related U.S. Application Data

(63) Continuation-in-part of application No. 15/838,378, filed on Dec. 12, 2017, now Pat. No. 10,448,149, which is a continuation of application No. 15/693,108, filed on Aug. 31, 2017, now abandoned, which is a continuation-in-part of application No. 29/620,580, filed on Feb. 28, 2017, now abandoned, and a continuation-in-part of application No. 29/620,579, filed on Feb. 28, 2017, now abandoned, and a continuation-in-part of application No. 29/620,578, filed on Feb. 28, 2017, now abandoned, and a continuation-in-part of application No. 29/620,577, filed on Feb. 28, 2017, now abandoned.

(Continued)

(51) Int. Cl.

| | |
|---|---|
| ***H03B 29/00*** | (2006.01) |
| ***H04R 1/30*** | (2006.01) |
| ***H04R 1/34*** | (2006.01) |
| ***H04R 1/28*** | (2006.01) |
| ***H04R 1/36*** | (2006.01) |
| ***H04R 1/02*** | (2006.01) |
| ***H04R 1/10*** | (2006.01) |
| ***H05B 45/14*** | (2020.01) |

(52) U.S. Cl.

CPC ............... *H04R 1/30* (2013.01); *H04R 1/023* (2013.01); *H04R 1/1083* (2013.01); *H04R 1/2807* (2013.01); *H04R 1/2823* (2013.01); *H04R 1/345* (2013.01); *H04R 1/36* (2013.01); *H05B 45/14* (2020.01); *H04R 1/1008* (2013.01); *H04R 1/1016* (2013.01); *H04R 2201/34* (2013.01); *H04R 2410/05* (2013.01); *H04R 2460/01* (2013.01)

(58) Field of Classification Search

CPC ...................................................... H03B 29/00

See application file for complete search history.

(56) References Cited

U.S. PATENT DOCUMENTS

2013/0311176 A1* 11/2013 Brown ................ H04R 1/1091 704/233

2014/0169579 A1* 6/2014 Azmi .................... G10K 11/16 381/71.6

(Continued)

*Primary Examiner* — Olisa Anwah

(74) *Attorney, Agent, or Firm* — Wayne R Howe

(57) ABSTRACT

Active noise control (ANC), including active and adaptive noise cancellation (ANC) with non-voice-coil transducers having highly linear transfer functions, such as planar transducers, planar magnetic transducers, electro-static transducers, and piezo-electric transducers. This active and adaptive noise cancellation (ANC) may be used with: planar transducer headphones and earphones; open-backed and closed-back headphones and earphones; in-ear earphones, and phase plugs.

27 Claims, 30 Drawing Sheets

Related U.S. Application Data

(60) Provisional application No. 62/600,216, filed on Feb. 15, 2017, provisional application No. 62/495,182, filed on Sep. 1, 2016.

(56) References Cited

U.S. PATENT DOCUMENTS

| | | | | |
|---|---|---|---|---|
| 2016/0267898 | A1* | 9/2016 | Terlizzi | H04R 1/1091 |
| 2016/0330546 | A1* | 11/2016 | Barrentine | H04R 3/04 |
| 2018/0020281 | A1* | 1/2018 | Wurtz | G10K 11/178 |
| 2018/0366099 | A1* | 12/2018 | Unruh | G10K 11/17873 |

* cited by examiner

Closed-Back In-Ear Planar Earphone

Open In-Ear Planar Earphone

Open In-Ear Planar Magnetic Earphone 100

Earphone properly inserted into Ear canal

ACTIVE NOISE CONTROL WITH PLANAR TRANSDUCERS

CROSS-REFERENCE TO RELATED APPLICATIONS

This application is a non-provisional application and claims the benefit of provisional application No. 62/600,216 "Noise Cancelling Planar Headphones and Earphones" filed Feb. 15, 2017, the entirety of which is incorporated by reference as if fully set forth herein. This application also claims the benefit of patent application Ser. No. 14/173,805 "Planar Magnetic Electro-Acoustic Transducer having Multiple Diaphragms", filed on Feb. 5, 2014, which in turn claims the benefit of Provisional Patent Application No. 61/892,417, filed on Oct. 17, 2013. This provisional application is also related to and will claim the benefit of what is currently Provisional Patent Application No. 62/495,182, "In-Ear Phase-Shifting Audio Device, System, and Method", filed on Sep. 1, 2016. This provisional application is also related to and claims the benefit of U.S. Pat. No. 9,258,638 "Anti-diffraction and phase correction structure for planar magnetic transducers" issued on Feb. 9, 2016, which claims the benefit of U.S. Provisional Patent Application No. 61/892,417, filed Oct. 17, 2013. This provisional application is also related to and claims the benefit of U.S. Pat. No. 9,287,029 "Magnet Arrays", issued on Mar. 15, 2016, filed on Sep. 26, 2014 as application Ser. No. 14/498,992.

The entirety of these aforementioned applications are not admitted to be prior art with respect to the present invention by their mention in the cross-reference or background sections.

BACKGROUND

Field

The disclosure relates to devices, methods, and systems for improved active noise control (ANC), including active and adaptive noise cancellation (ANC) with transducers having highly linear transfer functions, such as planar transducers. This active and adaptive noise cancellation (ANC) may be used with: planar transducer headphones and earphones; open-backed and closed-back headphones and earphones; in-ear earphones, and phase plugs.

Description of the Related Art

Active Noise Control (ANC) includes Active Noise Cancellation and Adaptive Noise Cancellation. Active Noise Control (ANC) may use feed-forward microphones, feedback microphones, or hybrid feedforward-feedback microphones. Microphones may be inside or outside of the housing. Active Noise Control may use analog and/or digital technologies, systems, or controllers. Active Noise Control (ANC) may be fixed or adaptive.

Dome-style and/or cone-style (dome-and-cone) dynamic transducers (also called speakers or drivers) typically have a voice coil and magnet assembly with the diaphragm comprising a dome and/or cone for moving the air at audio frequencies and creating sound waves. Dome-and-cone style dynamic speakers have many non-linearities as described by Hiller in "Loudspeaker Nonlinearities—Causes, Parameters, Symptoms", J. Audio Eng. Soc., Vol. 54, No. 10, 2006; Wolfgang Klippel. October Description of Non-linearities in Dynamic Transducers.

Planar transducers are of several types including: Planar magnetic transducers, Electro-static transducers, and piezoelectric transducers.

There is a continuous need for improvements in Active Noise Control (ANC), cone-and-dome style transducers, planar transducers, headphones, headsets, earphones, in-ear acoustic devices, hearing aids, earbuds, and other devices.

Aspects of the present invention satisfy the above described needs and provide further related advantages.

SUMMARY

Aspects of the present invention comprise devices, methods, and systems for improved Active Noise Control (ANC), including active and adaptive noise cancellation with improved frequency response, improved noise attenuation, controlled phasing and phase-shifting, increased feedback stability, improved phase coherence, improved linearity, decreased sound diffraction, improved acoustic loading, improved reflection characteristics, and decreased sound distortion. Further aspects of the present invention comprise devices, methods, and systems for acoustic noise cancellation using planar transducers for headphones and earphones including but not limited to in-ear earphones. Further aspects of the present invention comprise active noise cancellation and adaptive noise cancellation (together ANC) with phase plugs of various types, such as symmetrical, axisymmetrical, asymmetrical, and non-axisymmetrical. Further aspects of the present invention comprise active noise cancellation and adaptive noise cancellation (together ANC) for closed-back, open-backed, and semi-open-backed headphones and earphones. Further aspects of the present invention comprise active and adaptive noise cancellation (ANC) for in-ear earphones. Further objects of the present invention comprise active and adaptive noise cancellation (ANC) for earphones and headphones with controlled and uncontrolled leaks.

Aspects of the present invention comprise improvements of extremely low distortion transducer technologies of planar magnetic transducers, electrostatic transducers, and piezoelectric transducers with active and adaptive noise cancellation (ANC) for headphones and earphones, including closed-back, open-back, and semi-open-back headphones and earphones. Aspects of the present invention comprise active and adaptive noise cancellation (ANC) for earphones and headphones with novel phase-plug (FazorTM) designs and various other improvements.

Other aspects are directed to devices, methods, and systems that satisfy the needs as defined in the background section and to improve audio quality.

Typically, Active Noise Control (ANC) including Active Noise Cancellation and Adaptive Noise Cancellation is used to reduce background noise in headphones and earphones. The accepted thought and direction today in the audio industry is that ANC is only useful in noisy situations and environments, such as when people are traveling in airplanes, on trains, or working in noisy office or factory locations. As a result, today's audio industry "teaches" that ANC headphones and earphones must be light, inexpensive, portable, and mobile for people moving in and out of noisy environments.

Electro-dynamic speakers of the "voice coil", "cone", and "dome" style in headphones and earphones meet these qualifications of light, inexpensive, portable, and mobile. Cone/dome/coil transducers have become the industry standard for ANC headphones and earphones. They appear to be exclusively used with ANC headphones and earphones. In fact, since audiophile headphones tend to be large, bulky, heavy, and inefficient, the ANC industry "teaches against" using ANC in audiophile headphones and earphones. In addition, the industry thought is that ANC won't work well with large planar transducers because the large area diaphragms would require many microphones with many ANC inputs and a large amount of processing power. Therefore, from the ANC industry perspective, it is unobvious, indeed ridiculous, to use ANC with high-end planar transducers.

At the same time, from the audiophile perspective, ANC is not needed nor desired for high-end audiophile applications, since they usually listen in quiet environments such as in recording studios and quiet home-audio environments. From the audiophile perspective, the high-quality audio listening experience is the key motivating factor. Audiophiles are generally willing to use large, bulky, heavy, inefficient headphones and earphones, and spend considerable amounts of money on high-end equipment to enjoy the audiophile experience. From the audiophile perspective, ANC is thought to distort the sound, muddy the listening quality, create a muffled tone with its generally closed-back headphones, create an "artificial" sounding environment, and ruin the subtle nuances provided by high-end headphones and earphones. As a result, ANC today is anathema to audiophiles. Because audiophiles are opposed to any comprise of quality, members of the audiophile industry "teach against" using ANC in high-quality audiophile equipment, this also makes combining high-end planar transducers with ANC—unobvious.

Aspects of the present invention include planar transducers, headphones, and earphones. Planar transducers, particularly planar magnetic transducers in earphones and headphones are big, heavy, bulky, tend to be inefficient, and have large diaphragms with heavy magnets to achieve an extremely high-quality sound. These planar transducers, particularly planar magnetic transducers in headphones and earphones have been exceedingly praised in the audiophile community for their extremely wide and flat frequency response, extremely low distortion, and the ability to hear subtle nuances in the music.

What has not been recognized and is unobvious thus far to both the ANC industry and the audiophile industry is that ANC can be used to not only reduce noise, but to actually improve the quality of the high-end audiophile experience by reducing ANC distortion.

In an aspect or embodiment, an audio device (100), also variously called a speaker, a headphone, a headset, an earpiece, an earphone, an earbud, or a device that produces sound from an electro-magnetic signal comprises several elements. These elements generally include: an active noise control (ANC) system (340); at least one microphone (310, 320); and a transducer (90). The active noise control (ANC) system (340) includes an input (352) for receiving an audio source signal, at least one microphone input (312, 322) for receiving microphone signals, and an output (362) for providing a corrected audio signal (361). At least one microphone (310, 320) is connected to at least one microphone input (312, 322). The transducer (90) is a non-voice-coil transducer that includes an input (365) for receiving the corrected audio signal (361) from the ANC system (340) and an output (367) for providing output sound waves (390).

In one aspect the transducer (90) is a non-voice-coil transducer.

In another aspect, the transducer (90) is a non-cone transducer.

In another aspect, the audio device (100) comprises a planar transducer.

In another aspect, the audio device (100) the planar transducer (90) is a planar magnetic transducer.

In an aspect of the audio device (100) the audio device is a feed forward audio device, such that at least one microphone (310, 320) is a feed forward microphone (310), and at least one microphone input (312, 322) is a feed forward microphone input (312).

In an aspect, the audio device (100) is a feedback audio device, such that at least one microphone (310, 320) is a feedback microphone (320), and at least one microphone input (312, 322) is a feedback microphone input (322).

In an aspect, the audio device (100) is a hybrid feedforward-feedback audio device, such that at least one microphone (310, 320) is a feed forward microphone (310), and at least one microphone input (312, 322) is a feed forward microphone input (312).

In an aspect, the audio device (100) comprising an active noise control system (340) includes an adaptive noise cancellation system.

In an aspect, the audio device (100) of claim 1 comprises an active noise control system (340) that includes an analog or digital control system.

In an aspect, the audio device (100) further comprises a housing (101) which has: a proximal (meaning the part of the device close to the body, the head, or the ear) acoustic opening (60) configured for positioning proximal to an ear (370), and a distal (meaning the part of the device farther away or farthest away from the body, the head, or the ear) surface (310) located distally from the proximal acoustic opening (60). In an aspect, the planar transducer (90) is disposed in the housing (101) such that the planar transducer (90) divides the housing (101) into a proximal cavity (320) between the planar transducer (90) and the proximal acoustic opening (60), and a distal cavity (330) between the planar transducer (90) and the distal surface (310). In one aspect, at least one microphone (310, 320) is disposed in the housing (101). In an aspect, the at least one microphone (310, 320) may be disposed completely inside the housing, or it may be disposed completely outside of the housing, or it may be disposed partially within the housing, or partially outside of the housing.

In an aspect, the audio device (100) includes the proximal cavity (320) which includes at least one feedback microphone (320).

In an aspect, the audio device (100) includes the distal cavity (330) which includes at least one feed-forward microphone (310).

In an aspect, the audio device (100) includes the distal surface (310) configured with at least two acoustically transparent openings so that it is open-backed.

In an aspect, the audio device (100) includes the distal cavity (330) which contains acoustically absorbent material (330) so that it is semi-open or semi-closed back.

In an aspect, the audio device (100) planar transducer (90) comprises a planar magnetic transducer (392).

In an aspect, the audio device (100) planar transducer (90) comprises an electro-static transducer (394).

In an aspect, the audio device (100) planar transducer assembly (90) comprises a piezo-electric transducer (396).

In another aspect, the audio device (100) further comprises: a housing (101) having a proximal acoustic opening (60) configured for positioning in an ear canal, and a distal surface (310) located distally from the proximal acoustic opening (60); at least one planar transducer (90) disposed in the housing (101) such that the planar transducer (90) divides the housing (101) into a proximal cavity (320) between the planar transducer (90) and the proximal acoustic opening (60), and a distal cavity (330) between the planar transducer (90) and the distal surface (310); and at least one microphone (310, 320) disposed in the housing (101).

In an aspect, the audio device (100) proximal cavity (320) includes at least one feedback microphone (320).

In an aspect, the audio device (100) proximal cavity (320) includes a phase plug (70).

In an aspect, the audio device (100) phase plug (70) includes at least one feedback microphone (320).

In an aspect, the audio device (100) feedback microphone (320) embedded in the phase plug (70) has an internal microphone opening (13) leading toward the proximal acoustic opening (60).

In an aspect, the audio device (100) phase plug (70) internal microphone opening (13) acts as a waveguide toward the proximal acoustic opening (60).

In an aspect, the audio device (100) of claim 12 such that the distal cavity (330) includes at least one feed-forward microphone (310).

In an aspect, the audio device (100) distal surface (310) is configured with at least one acoustically transparent opening, such that it is open-backed.

In an aspect, the audio device (100) planar transducer (90) includes a planar magnetic transducer (392).

In an aspect, the audio device (100) planar transducer (90) includes an electro-static transducer.

In an aspect, the audio device (100) planar transducer (90) includes a piezo-electric transducer (396).

Thus, these novel and unobvious aspects provide improved audio performance, such as: improved frequency response, phasing, and phase coherence; decreased sound diffraction; improved acoustic loading; improved reflection characteristics; and decreased sound distortion—while at the same time enabling active noise control (ANC), including active noise cancellation and adaptive noise cancellation. Present embodiments satisfy these and other needs and provide further related advantages.

BRIEF DESCRIPTION

Active noise cancellation (ANC) may also be known as active noise control, noise cancellation, active noise reduction (ANR), electronic noise cancellation, electronic noise reduction, and other similarly related terms. Various active noise cancelling devices, methods, and systems exist for headphones and earphones, but without the benefits of the present invention as herein described.

Additionally, various in-ear acoustic devices exist, such as hearing aids, earbuds, and other devices without the benefits of the present invention as herein described.

Previously, active and adaptive noise cancellation (ANC) techniques have been associated with low cost dynamic transducers and headphones. They have not been considered as part of high-end audio culture. However, aspects of the present invention disclose novel, unobvious improvements to planar transducers with ANC that have previously been unthinkable. Thus, an aspect of the present invention provides extremely high-quality sound reproduction with astonishingly low noise performance.

Active Noise Control (ANC) includes Active Noise Cancellation and Adaptive Noise Cancellation. All references to ANC in this document refer to both active noise cancellation and adaptive noise cancellation. ANC will refer interchangeably to Active Noise Control, Adaptive Noise Control, Active Noise Cancellation, and/or Adaptive Noise Cancellation, as well as Active Noise Reduction, and Adaptive Noise Reduction.

For purposes of the present disclosure, ANC is treated as a black box with various capabilities as known in the art, and which aspects of the present invention utilize.

The goal of Active Noise Cancellation (ANC) is to reduce the amplitude of the sound pressure level of the noise which is incident on the receiver or ear by "actively" introducing a secondary, out-of-phase acoustic field, "anti-noise". The resulting destructive interference pattern reduces the unwanted sound.

Active Noise Cancellation (ANC) is based on either feedforward control or feedback control. In feedforward control, one or more microphones sensing ambient noise are placed between the noise source and the speaker (usually within the headphone cup). The reference input coherent with the noise is sensed before it propagates past the secondary source. In feedback control, one or more mics are placed between the speaker and the listener's ear. Here, the active noise controller attempts to cancel the noise without the benefit of an "upstream" reference input. Structures for feedforward ANC are classified into (1) broadband adaptive feedforward control with a control field reference sensor, (2) narrowband adaptive feedforward control with a reference sensor that is not influenced by the control field. Feedforward ANC is generally more robust than feedback ANC particularly when the feedforward system has a reference input isolated from the secondary anti-noise source. Active Noise Cancellation may be digitally controlled or analog controlled.

Adaptive Noise Cancellation is a method that measures user and or environment specific acoustic responses and adjusts ANC filters and/or parameters to provide better noise reduction or cancellation. Adaptive ANC may be used in conjunction with feedback, feed-forward or hybrid ANC. Adaptive ANC may be digitally controlled or analog controlled.

Active and adaptive noise cancellation (ANC) comprises reducing unwanted sound or noise by adding or subtracting the unwanted sound or noise at approximately the same amplitude but out of phase (inverted phase or antiphase) from the original unwanted sound or noise. ANC can be achieved through various techniques, such as feedback ANC, feed-forward ANC, and hybrid ANC which is a combination of both feed-forward and feedback ANC and adaptive ANC.

Adaptive Noise Cancellation (ANC) generally removes or suppresses noise from a signal using adaptive filters. Examples include: Kalman filters, Wiener filters, Recursive-Least-Square (RLS) algorithm, Least Mean Square (LMS) algorithm, Affine Projection algorithm (APA), and other filters and algorithms as known in the art. For purposes of the present invention we consider all electronic techniques of Active Noise Control, Active Noise Cancellation, and Adaptive Noise Cancellation as a Black Box, which this invention may use.

Aspects of the present invention may use conventional noise cancellation methods (active or passive), conventional feed-forward methods, conventional feedback methods, and adaptive noise cancellation methods including digital filters, such as Wiener filters, Kalman filters, Adaptive Filters, adaptive algorithms, such as Least-Mean-Square (LMS), Normalized Least-Mean-Square (NLMS), Recursive Least Square (RLS), and any other variations or adaptations of active or adaptive noise cancellation.

How Feedback ANC is supposed to work: Feedback ANC is where the feedback microphone is placed in such a way that it can monitor the sound signal between the transducer and the ear. In theory, the feedback microphone picks up both the audio signal from the speaker driver, and noise which has gotten into the headphone or earphone. That "Signal Plus Noise" is fed from the microphone back into the ANC unit where it is compared to the original input signal. Using various different ANC algorithms which need not be discussed in detail for purposes of the present disclosure, the ANC system determines the error between the original signal and the "Signal Plus Noise". It then modifies the original input signal to compensate for the error and feeds the "corrected signal" back to the speaker. In this way, much of the noise is cancelled out so the listener doesn't hear as much noise.

Problems: In practice, there are problems with this approach. First, there is a time delay between the diaphragm and the ANC feedback microphone. This inherent delay occurs before the microphone can send the feedback sound signal to the ANC system for processing. This delay varies according to how far the feedback microphone is deployed from the transducer and can cause problems based on the distance between the diaphragm and the transducer.

The ANC delay problem between the diaphragm and the microphone. Problems may be caused by the delay between the diaphragm and the microphone, e.g.:

1. Moving the mic closer to the eardrum (and away from the diaphragm) ostensibly establishes a highly corrected signal closer to the eardrum, so in theory, the ear perceives a signal that is more "correct" closer to the ear.
2. However, increasing the distance from the diaphragm to the microphone can cause increase time delay problems, and cause the ANC system to miscalculate the correction signal and actually increase distortion.

Table 1 below shows the effect of varying the distance between the diaphragm and the feedback microphone. The top row of Table 1 shows examples of possible Distances from the Diaphragm to the Feedback Microphone in inches, with the second row showing the Time Delay from Diaphragm to Feedback Mic in milliseconds that results, using the speed of sound as 1125 feet per second. The third row shows the where theoretically Total Frequency Cancellation in KHz. may occur at one-half wavelength delay based on the time delay.

TABLE 1

Effect of Varying Distance Between Diaphragm and ANC Feedback Microphone

| | | | | | | | | | | |
|---|---|---|---|---|---|---|---|---|---|---|
| Distance from Diaphragm to Feedback Mic (inches) | ½ in. | 0.675 in. | ¾ in. | 1 in. | 1⅛ in. | 1¼ in. | 1⅜ in. | 1½ in. | 1¾ in. | 2.0 in. |
| Time Delay from Diaphragm to Feedback Mic (msec.) | 0.037 msec. | 0.050 msec. | 0.056 msec. | 0.074 msec. | 0.083 msec. | 0.092 msec. | 0.101 msec. | 0.110 msec. | 0.128 msec. | 0.147 msec. |
| Where Total Frequency Cancellation Occurs (KHz.) | 27.0 KHz. | 20.0 KHz. | 18.0 KHz. | 13.5 KHz. | 12.0 KHz. | 10.8 KHz. | 9.8 KHz. | 9.0 KHz. | 7.7 KHz. | 6.8 KHz. |

As shown in Table 1, if the distance from the diaphragm to the microphone is 0.675 inches or greater, then ANC will totally cancel frequencies at 20 KHz. This is slightly greater than ½ inch, which is a very reasonable spacing considering the physical limitations of mounting a microphone in an audio device. At a quarter wavelength delay, half of the distance of 0.675 inches, i.e., 0.3375 inches or about ⅓ of an inch, phase cancellations caused by time delays will result in approximately ½ power at 10 KHz. Moving to the right on the chart, a distance of 1 inch will result in total phase cancellation at 13.5 KHz.

Effects of Delay

Noise: With Feedback ANC, noise must recur for long enough for ANC to capture it, process it, and add corrections to the signal. The ANC system removes ongoing, recurring noise that continues at certain frequency bands. In Feedback ANC, noise that has not been transmitted by the diaphragm is received at the feedback microphone. This noise plus speaker sound is sent to the ANC system where it is compared with the original signal. Both the "noise plus speaker" sound is time delayed compared to the original speaker sound. The ANC system processes the original and delayed signals in different frequency bands, extracts the dissimilarities between the two signals in those frequency bands, and sends the "corrected" signal to the speaker without the noise. In theory, this reduces the noise level for enduring and ongoing noise in the same frequency bands. Thus, ANC only removes noise that continues to recur longer than the time delay between the diaphragm and the microphone, plus the processing delay. In other words, noise must recur to be removed. ANC does not remove noise that does not recur.

Speaker non-linearities and distortion. Non-linearities in voice-coil, dome, and cone transducers are very well known and documented. First, the magnet and coil have non-linearities, and then the stress motion movements on the coil cause distortions on the cone and dome. These distortions are then transferred by the voice-coil, dome, and cone-style transducers to the sound waves. These distorted sound waves are then received by the feedback microphone. In addition, the distorted wave is delayed by the distance between the diaphragm and the microphone.

An example of speaker distortion is shown in FIG. 29, which shows the detail of the original input signal at the top, and the sound wave output at the bottom from two different transducers. The sound wave output at the bottom showing great detail in matching the original input signal is from a highly linear planar transducer. The sound wave output at the bottom showing curves that have lost the detail of the original input signal at the top are from a typical voice-coil, cone, and dome-style transducer, which "smooths over" the waveform as part of its distortion characteristics.

ANC can increase speaker distortion. In the ANC feedback case, this means that speaker distortion which adds signals that weren't originally there get transmitted by the speaker to the feedback microphone and into the ANC system where they are processed as "garbage in-garbage out". In addition, sounds that were there originally in the signal, but got "smoothed over" or eliminated by speaker distortion do not get transmitted by the speaker to the feedback microphone and into the ANC system to be corrected!

After the diaphragm to microphone delay, the delayed distorted signals and/or lack of original signals get sent to the ANC system. The ANC system bucketizes the signals into different frequency bands and compares them with the original non-delayed signal. In the case of added speaker distortion, the ANC system attempts to correct its original non-delayed signal by eliminating the erroneous speaker distortion at its frequency bands from the frequency bands of the original signal. However, in the case of the added distortion, the corrected output signal has been corrected for something that was not there in the first place, i.e., it has "over-corrected". This "over-correction" is another distortion from the original signal, and makes a second loop through the ANC system, and may continue to cycle through the speaker to microphone to ANC system loop and continue to distort the signal.

A similar type of distortion occurs in ANC for the signals that are smoothed over and the distortion is from signals removed by the speaker. Similarly, these removed signals also pass through the ANC system in continuing time loops of the ANC system continually trying to correct the distortion by adding more distortion with ANC "under-correction."

Brief transient distortions: Here the ANC system is not dealing with recurring or non-recurring noise, or with enduring speaker distortions lasting longer than the time delay from diaphragm to feedback microphone. Instead these are instantaneous transient signals that are very brief (less than a wavelength in many cases), and possibly shorter than the time delay between the diaphragm and the microphone. These may be caused by brief noise "pops" that are not enduring, impulse noises, or brief distortions of the speaker. In the case of brief transient distortion, the ANC system may or may not sense the transient distortion at all and may or may not "over-correct" or "under-correct", depending upon how long the transient is, when it occurred, and how long the diaphragm to speaker delay is.

ANC Distortion: Today, ANC is taught as a mechanism for reducing noise, which it does in many cases. What is not well-known or solved is that ANC can cause, extend, and perpetuate distortion. This has been unobvious to the industry.

Unobvious: Part of the reason ANC distortion is unobvious is that there are no easy tools to measure ANC distortion. It is not measured by Total Harmonic Distortion (THD) since Sine Wave tones don't stress the dynamic cone like true audio does. It is also barely measured by Intermodulation Distortion (IMD), because the IMD repeats two tones and is generally just used for detection of sidebands. These IMD tones are also enduring, so ANC is better at processing enduring tones. Finally, brief transients can be less than a half-wave cycle, which is too fast for even the fastest Feedback ANC.

Another reason ANC distortion is unobvious is the ANC industry "teaches against" highly-linear planar magnetic transducers for use in earphones and in-ear earphones because they are large, heavy, inefficient, expensive, and use more power.

Another reason ANC distortion is unobvious is that the audiophile industry "teaches against" ANC use because ANC is thought to distort the sound, muddy the listening quality, create a muffled tone with its generally closed-back headphones, create an "artificial" sounding environment, and ruin the subtle nuances provided by high-end headphones and earphones.

Lessons learned: The unobvious lesson learned is that voice-coil, cone, and dome speaker distortion and non-linearities can actually cause "ANC Distortion", which then can multiply and extend itself due to time delay.

Solution—Planar magnetic ANC technology: Planar technology, particularly planar magnetic transducer technology is one of the most linear and accurate technologies for faithful music reproduction. It has been considered a heavy, exotic, and little-known technology that was exclusively used for high-end applications where the sound quality is the primary function. It has had very limited usage in headphones due to heavy magnets and inefficiencies, which required larger diaphragms and high-power amplifiers for headphones. Usage in small earphones has been out of the question for these same reasons. The result is that more efficient dynamic transducers with higher distortion have been used almost exclusively for headphones and earphones.

Planar technologies have also required hand-crafted assembly due to exacting demands on the magnetic structure and accurate tensioning of the diaphragms. Recent improvements in planar technology include higher efficiency magnet configurations, multiple diaphragms, anti-diffraction, and other manufacturing improvements have enabled planar technologies in lighter weight, mobile, headphones and earphones, especially with planar magnetic transducer technologies.

Planar magnetic technologies offer some capabilities to drastically decrease speaker distortions and delay times, so that ANC distortion is radically minimized. The planar magnetic capabilities include:

- Uniform strong force distribution across the whole diaphragm surface driving very thin and lightweight diaphragm with very high acceleration rate creating very faithful acoustical output comparing to the electrical driving signal. This creates a super detailed and natural response;
- Highly linear transfer function or impulse response (Acoustic Output=Electrical Input);
- Phase coherence;
- Accurate tracking movement;
- Extremely low amplitude modulation distortion;
- Extremely good frequency response curves;
- Extremely low distortion which significantly helps ANC distortion;
- Diaphragms with $1/10^{th}$ the mass of our other diaphragms;
- Highly linear BH (flux density vs magnetic field strength) curves with diaphragms;
- Diaphragm impedance highly resistive as opposed to inductive (like cone/dome-style voice coils);

Figure 5:
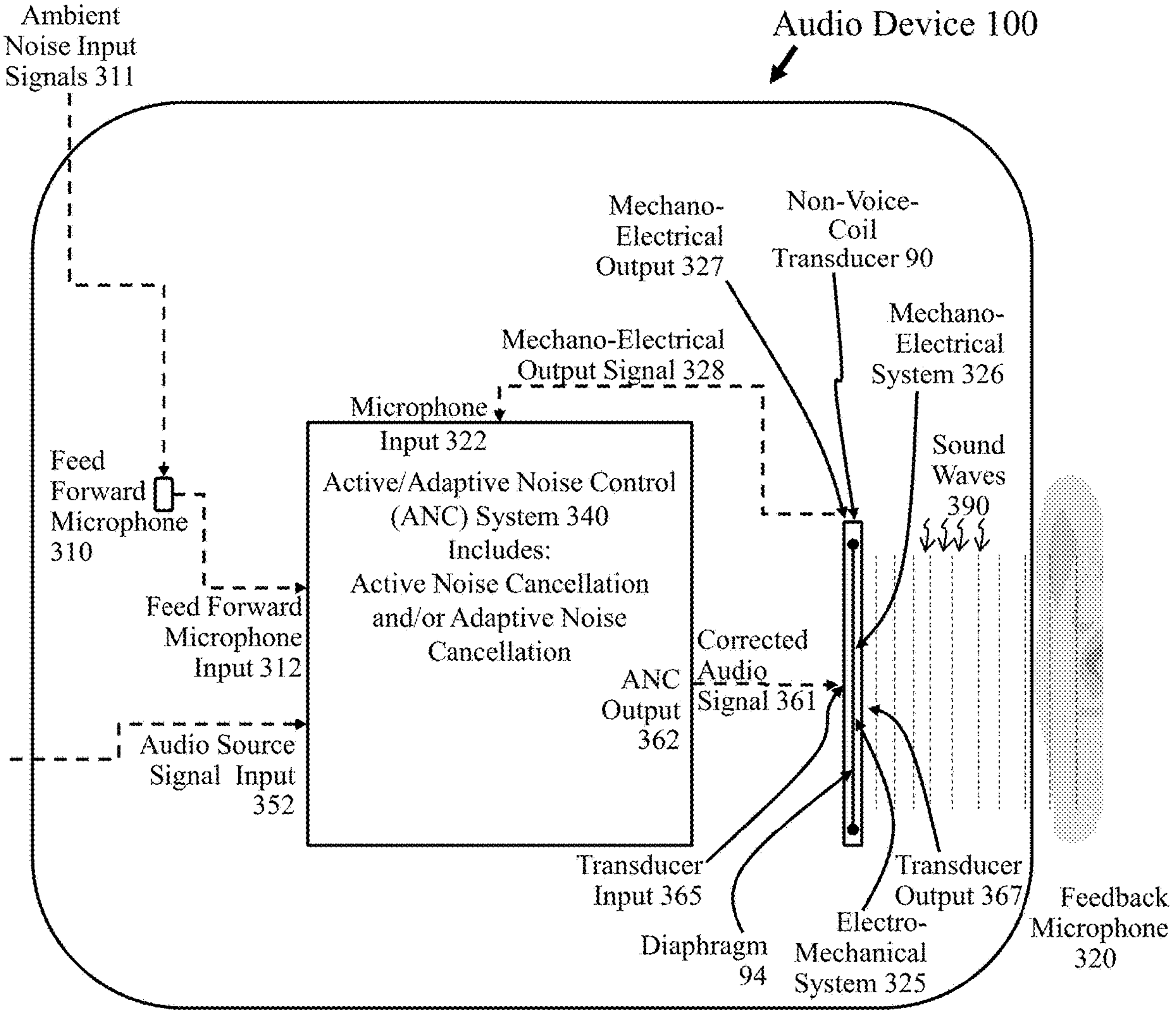

FIG. 5 is an exemplary functional or illustrative schematic of reducing time delay from the diaphragm to the microphone by embedding the microphone on the diaphragm of the transducer itself. FIG. 5 shows a Hybrid Feed-Forward-Feedback Audio Device 100 with Active Noise Control System (ANC) (340) including Active and/or Adaptive Noise Control with Audio Source Input (352), ANC Output (362), At least one Microphone (310, 320), at least One Microphone Input (312, 322), Audio Source Input (352), ANC Output (362), and a Non-Voice-Coil Transducer (90)

FIG. 5 Includes a diaphragm (94) including an electromechanical system (325) for converting the input (365) into the output (367) for providing sound waves (390), and a mechano-electrical system (326) coupled to the diaphragm (94) having a mechano-electrical output (327) such that motion of sound waves (390) impacting the diaphragm (94) generates a proportionate mechano-electrical output signal (328), wherein the mechano-electrical system (326) acts as the at least one microphone (310, 320) connected to the at least one microphone input (312, 322).

Figure 6:
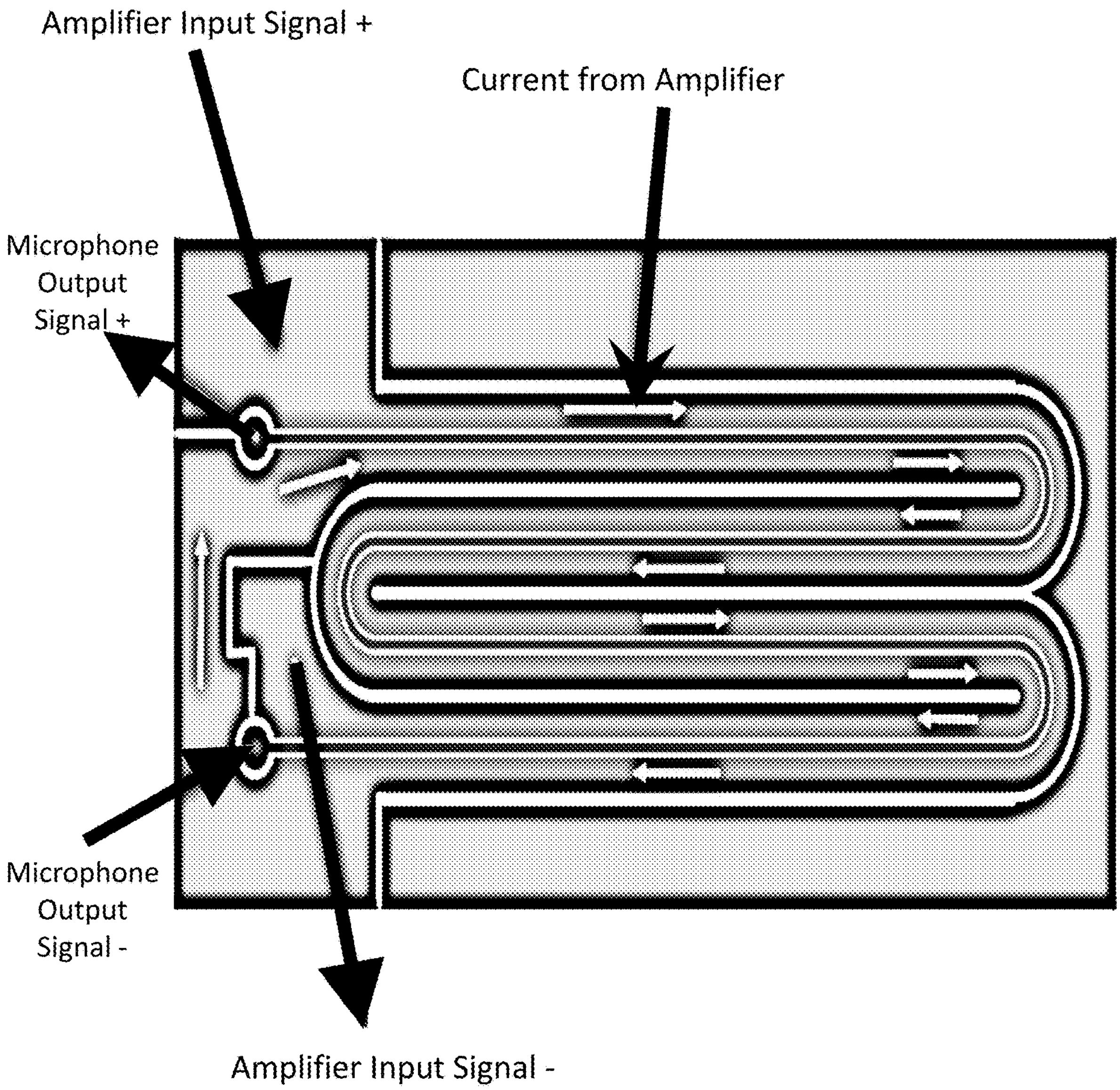

FIG. 6 is an exemplary functional or illustrative schematic view of diaphragm trace pattern with 2 separate circuits. Dual loop main circuit carries the current from the amplifier which interacts with magnetic field and moves diaphragm back and forth creating sound. Movement of the diaphragm causes a small voltage to be induced in a second circuit which can be used as a feedback signal for ANC.

Figure 7:
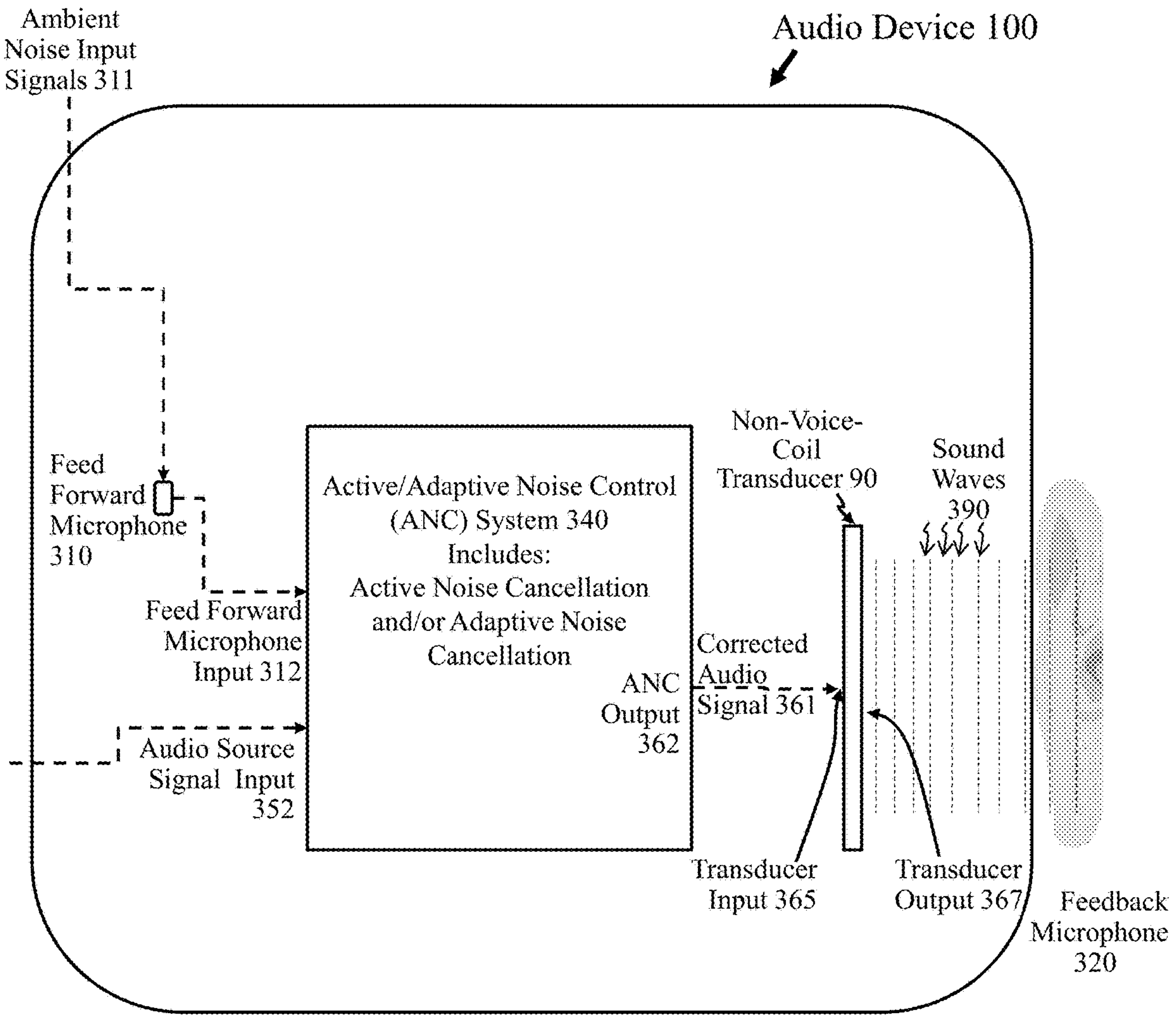

FIG. 7 is an Exemplary Functional View of Feed-Forward Audio Device 100 with Active Noise Control System (ANC) (340) including Active and/or Adaptive Noise Control with Audio Source Input (352), ANC Output (362), Feed Forward Microphone (310), Audio Source Input (352), ANC Output (362), and a Non-Voice-Coil Transducer (90).

Figure 8:
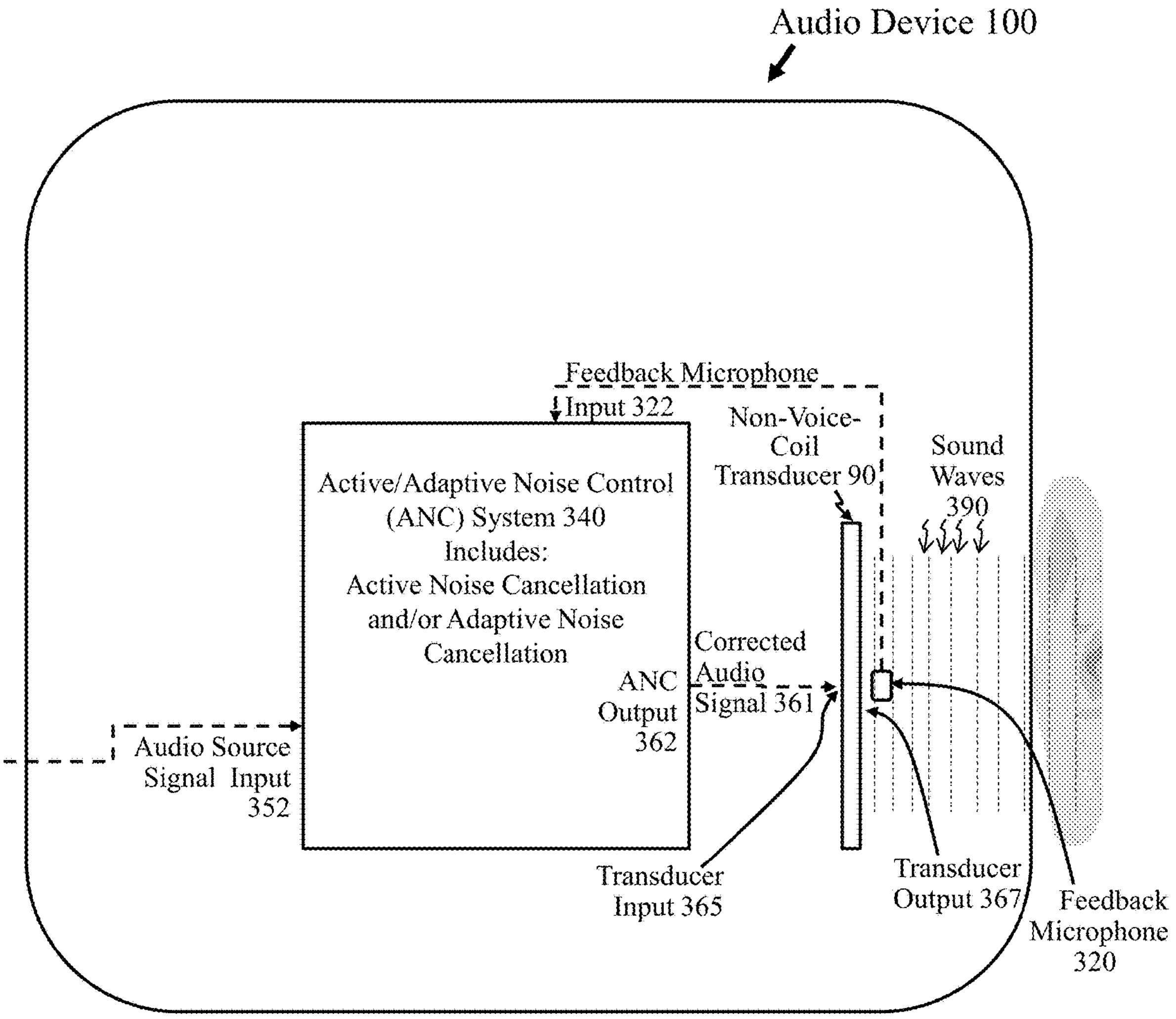

FIG. 8 is an exemplary functional or illustrative schematic view of Feedback Audio Device 100 with Active Noise Control System (ANC) (340) including Active and/or Adaptive Noise Control with Audio Source Input (352), ANC Output (362), Feedback Microphone (320), Feedback Microphone Input (322), and a Non-Voice-Coil Transducer (90).

Figure 9:
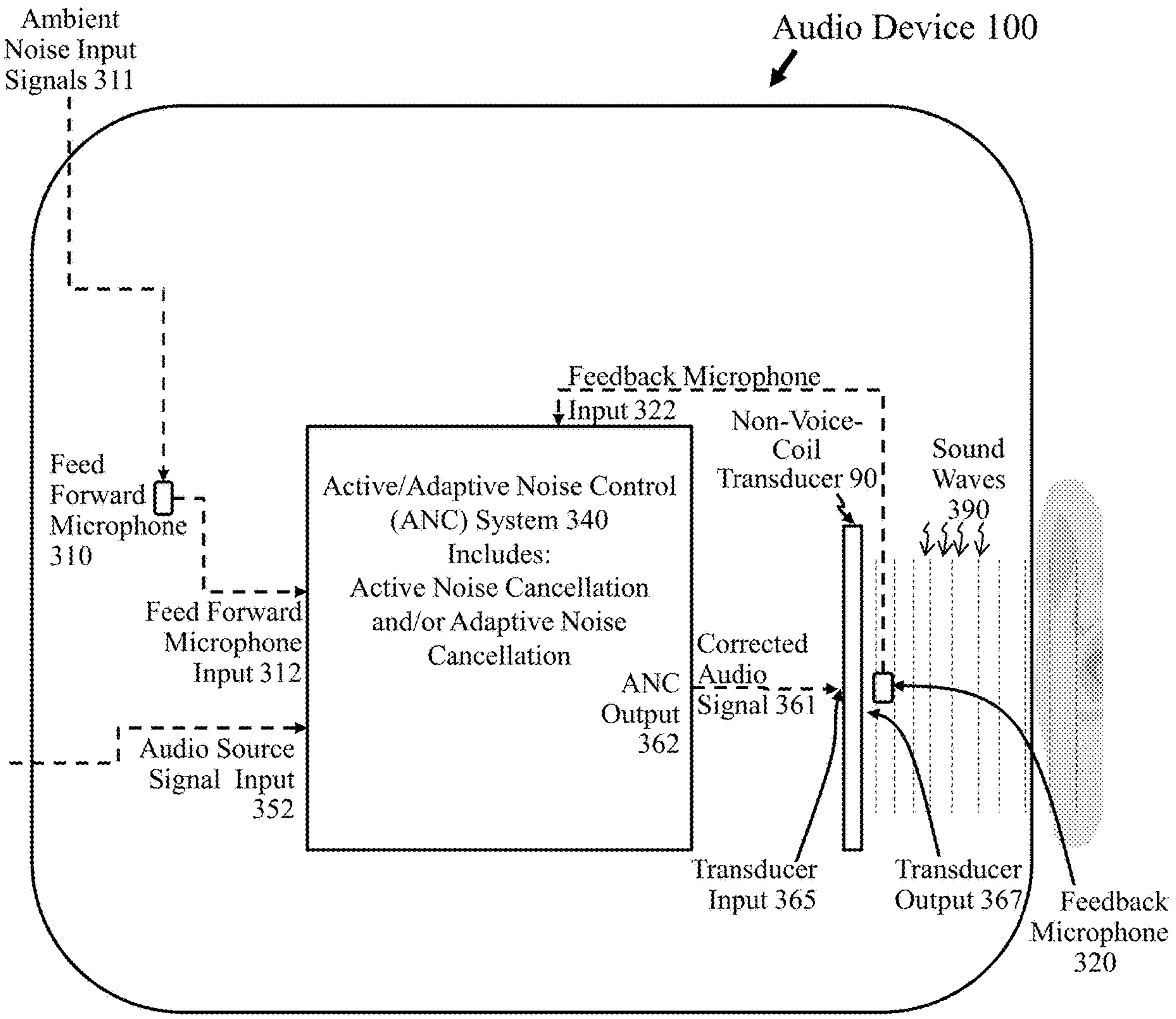

FIG. 9 is an exemplary functional or illustrative schematic view of Audio Device (100) with Active Noise Control System (ANC) (340) including Active and/or Adaptive Noise Control with of Hybrid Feedforward-Feedback Audio Device 100 with Active Noise Control System (ANC) (340) including Active and/or Adaptive Noise Control with Audio Source Input (352), ANC Output (362), Microphone inputs (312, 322), Microphones (310, 320), and a Non-Voice-Coil Transducer (90).

Figure 10:
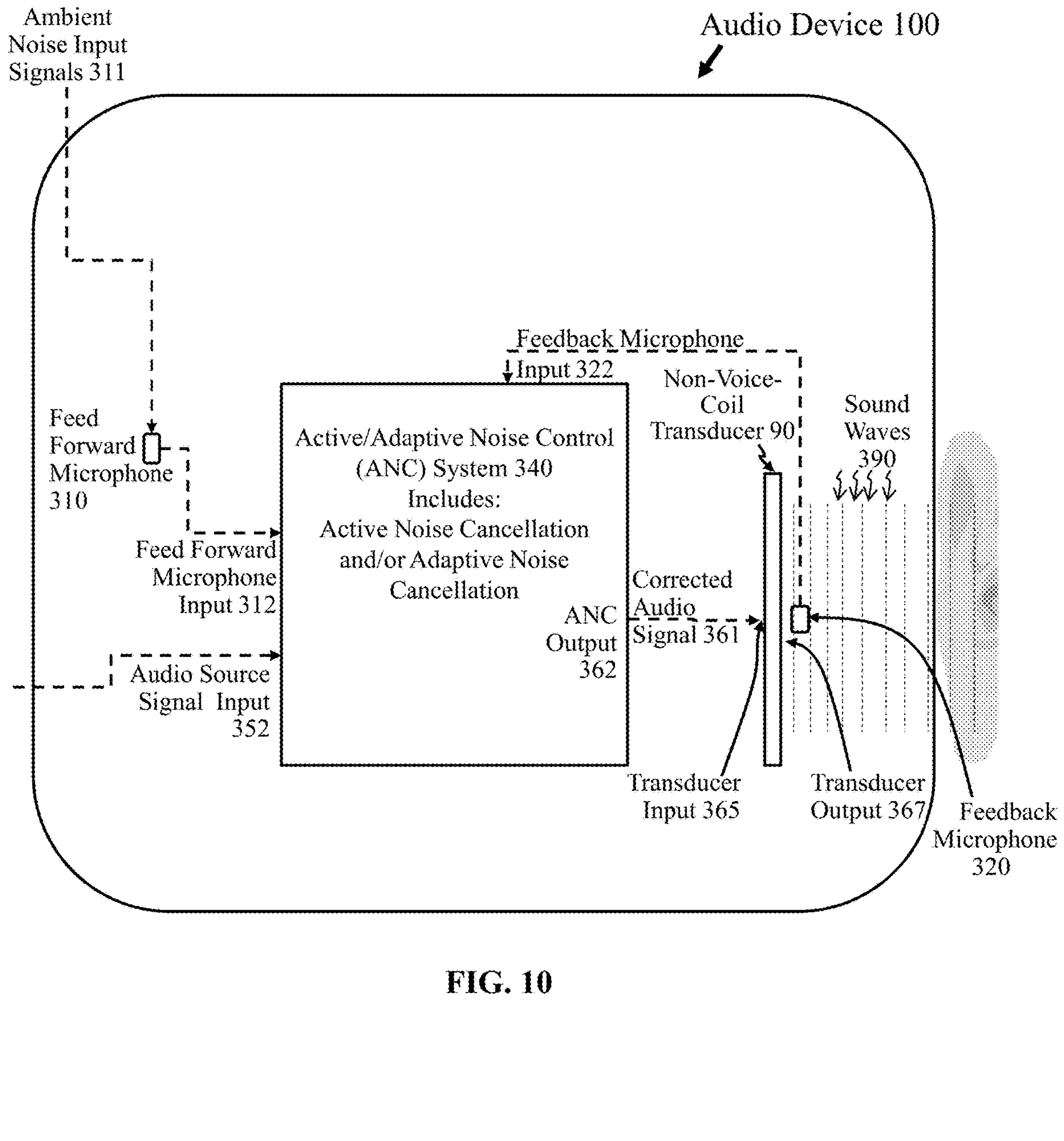

FIG. 10 is an exemplary functional or illustrative schematic view of Audio Device 100 with Active Noise Control System (ANC) (340) including Active and/or Adaptive Noise Control with Audio Source Input (352), ANC Output (362), At Least One Microphone input (312, 322), At Least One Microphone (310, 320), and a Non-Voice-Coil Transducer (90).

Figure 11:
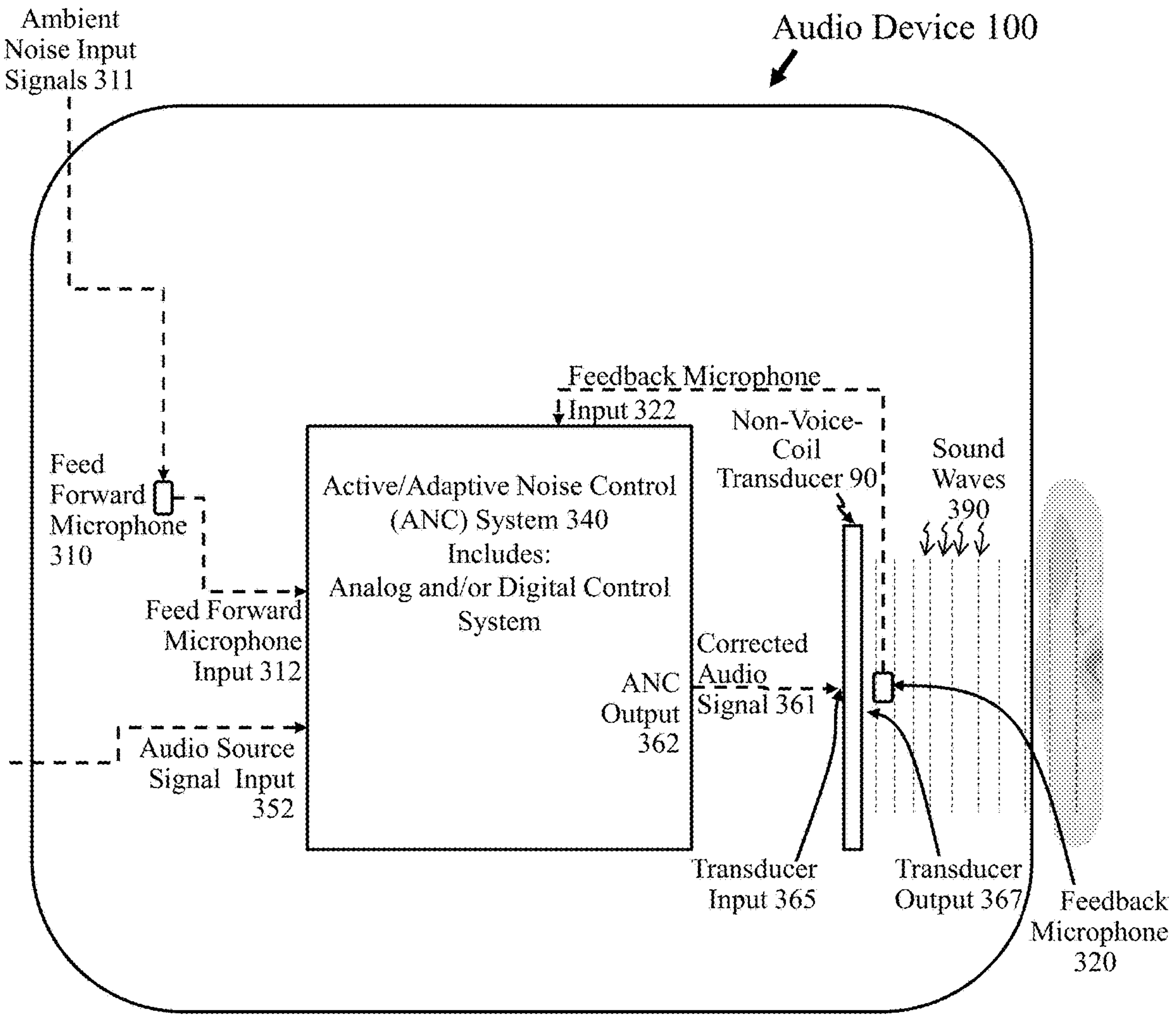

FIG. 11 is an exemplary functional or illustrative schematic view of Audio Device 100 with Active Noise Control System (ANC) (340) including Analog and/or Digital Control System with Audio Source Input (352), ANC Output (362), At Least One Microphone input (312, 322), At Least One Microphone (310, 320), and a Non-Voice-Coil Transducer (90).

Figure 12:
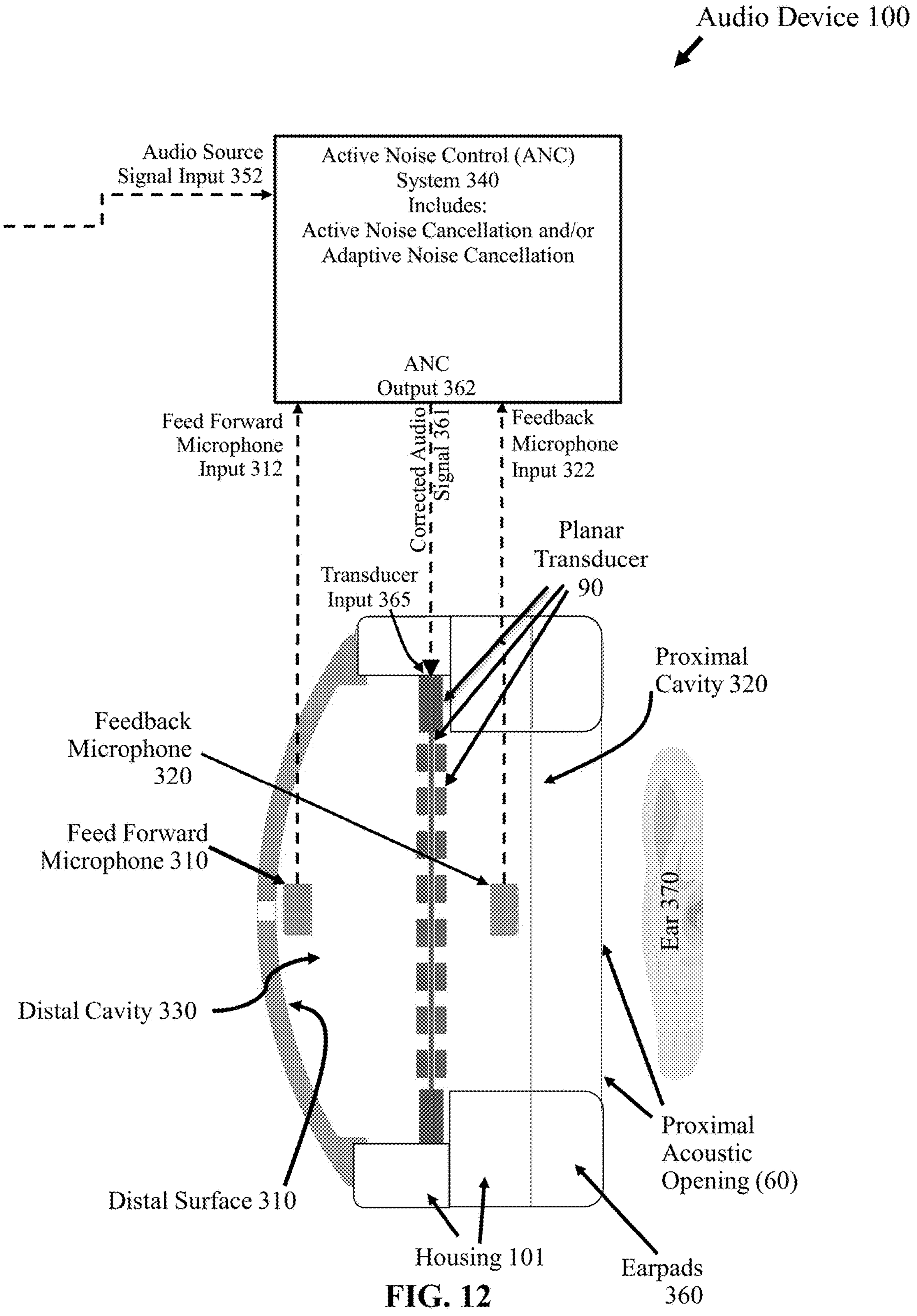

FIG. 12 is a Cross-sectional View of Closed-Back Audio Device 100 with Housing (101), Planar Transducer (90), and Active Noise Control System (340).

Figure 13:
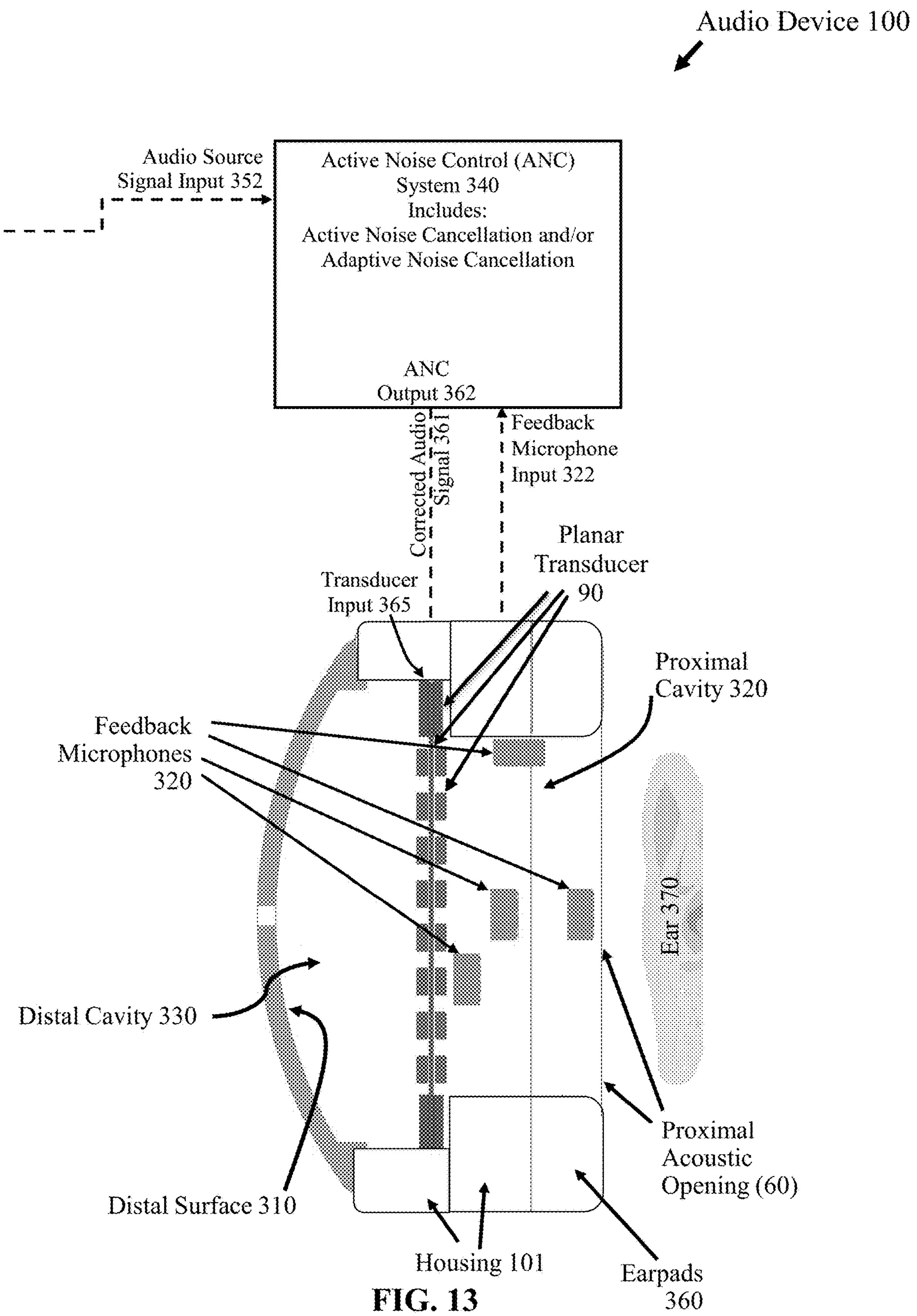

FIG. 13 is a Cross-sectional View of Closed-Back Audio Device 100 with Housing (101), Planar Transducer (90), and Active Noise Control System (340).

Figure 14:
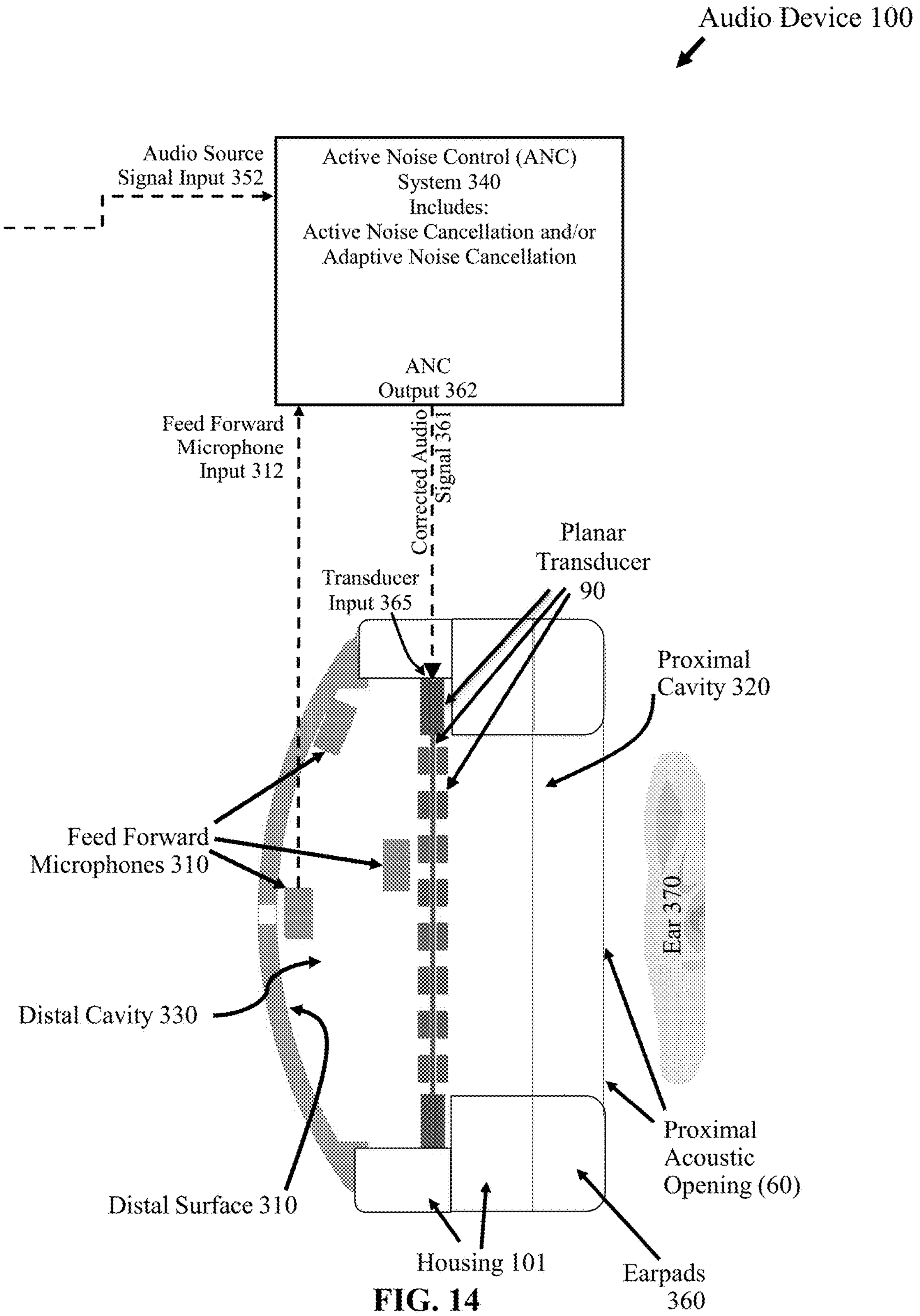

FIG. 14 is a Cross-sectional View of Closed-Back Audio Device 100 with Housing (101), Planar Transducer (90), and Active Noise Control System (340).

Figure 15:
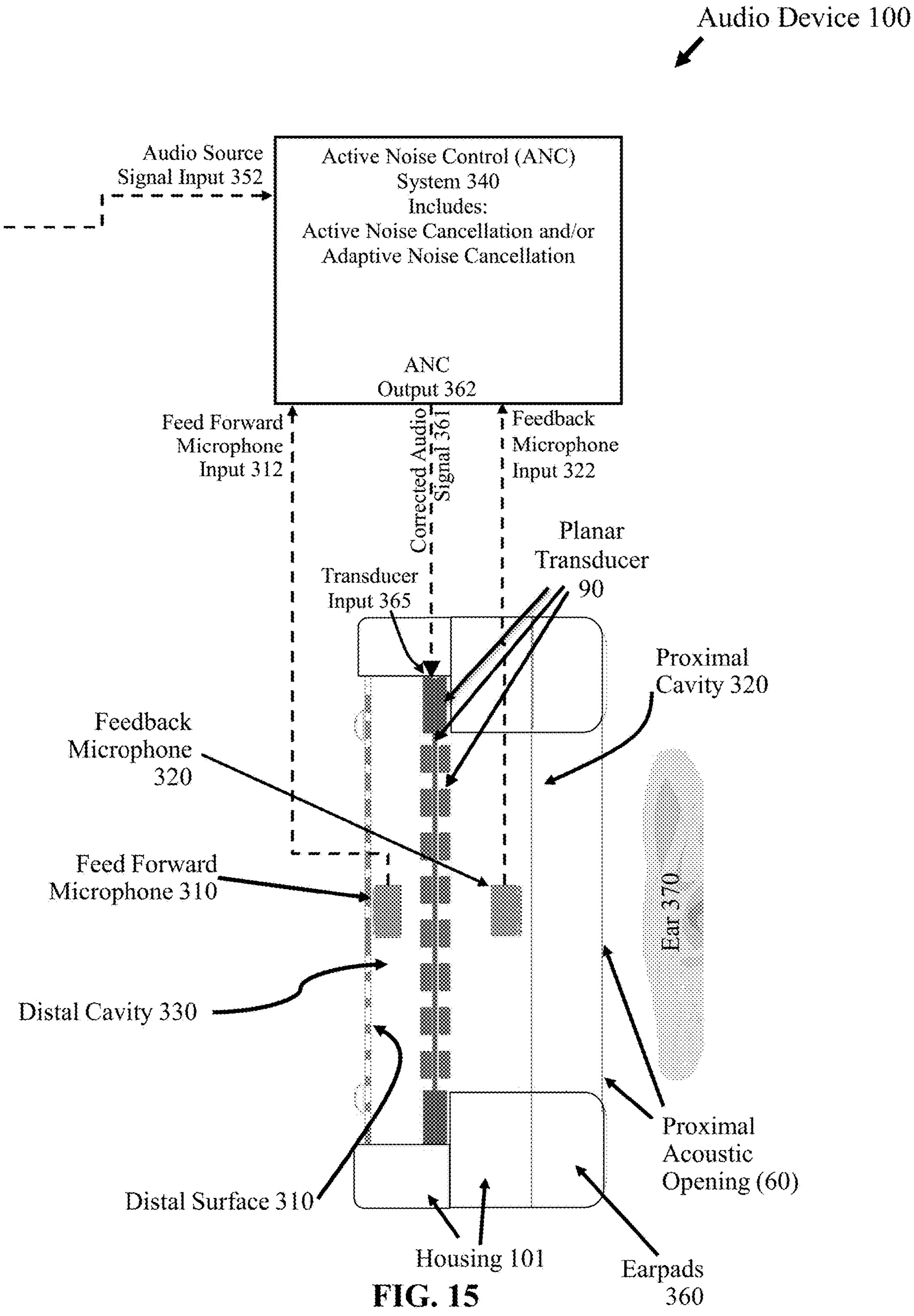

FIG. 15 is a Cross-sectional View of Open-Back Audio Device 100 with Housing (101), Planar Transducer (90), and Active Noise Control System (340).

Figure 16:
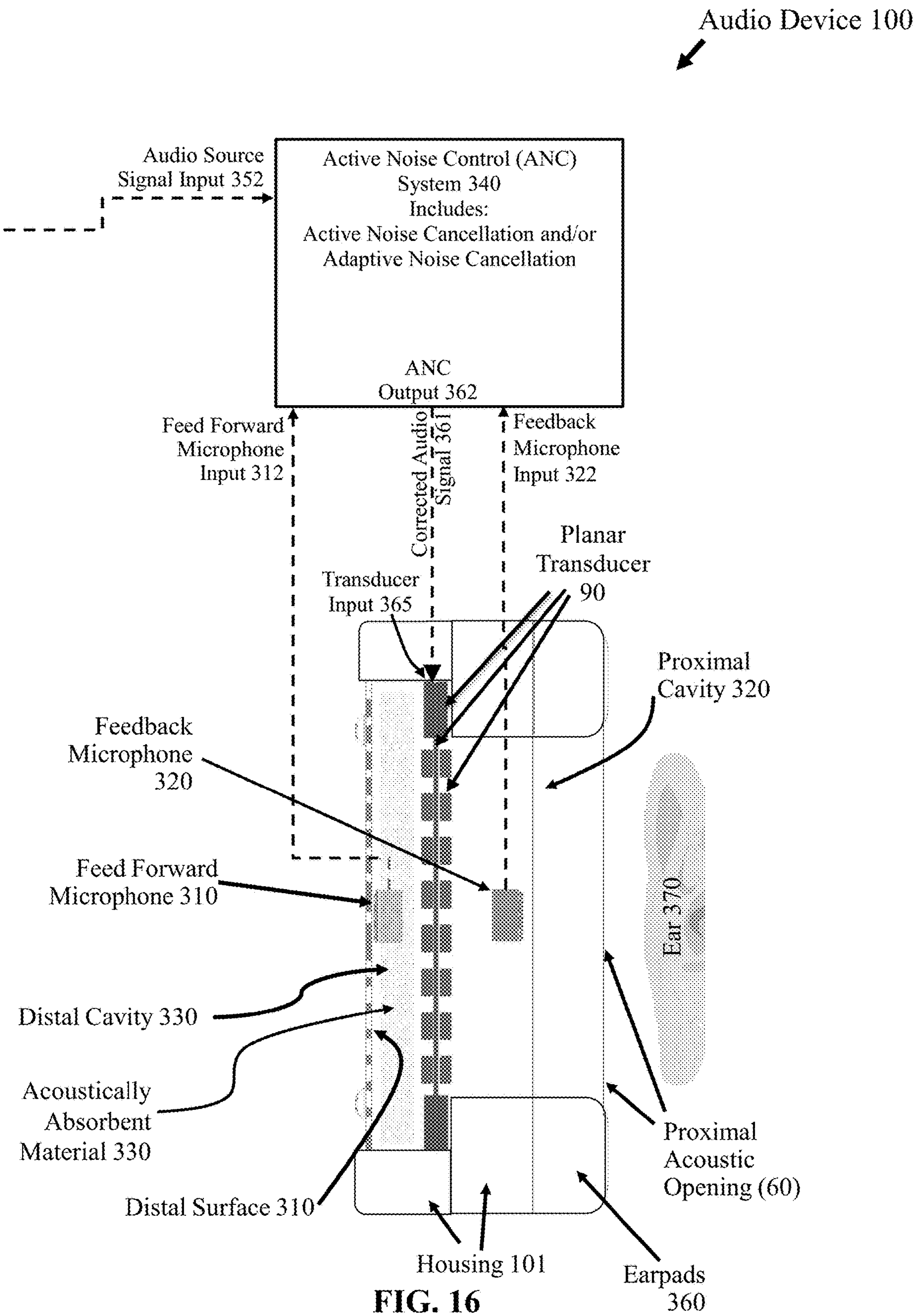

FIG. 16 is a Cross-sectional View of Open-Back Audio Device 100 with acoustically absorbent material (33) in Housing (101), Planar Transducer (90), and Active Noise Control System (340).

Figure 17:
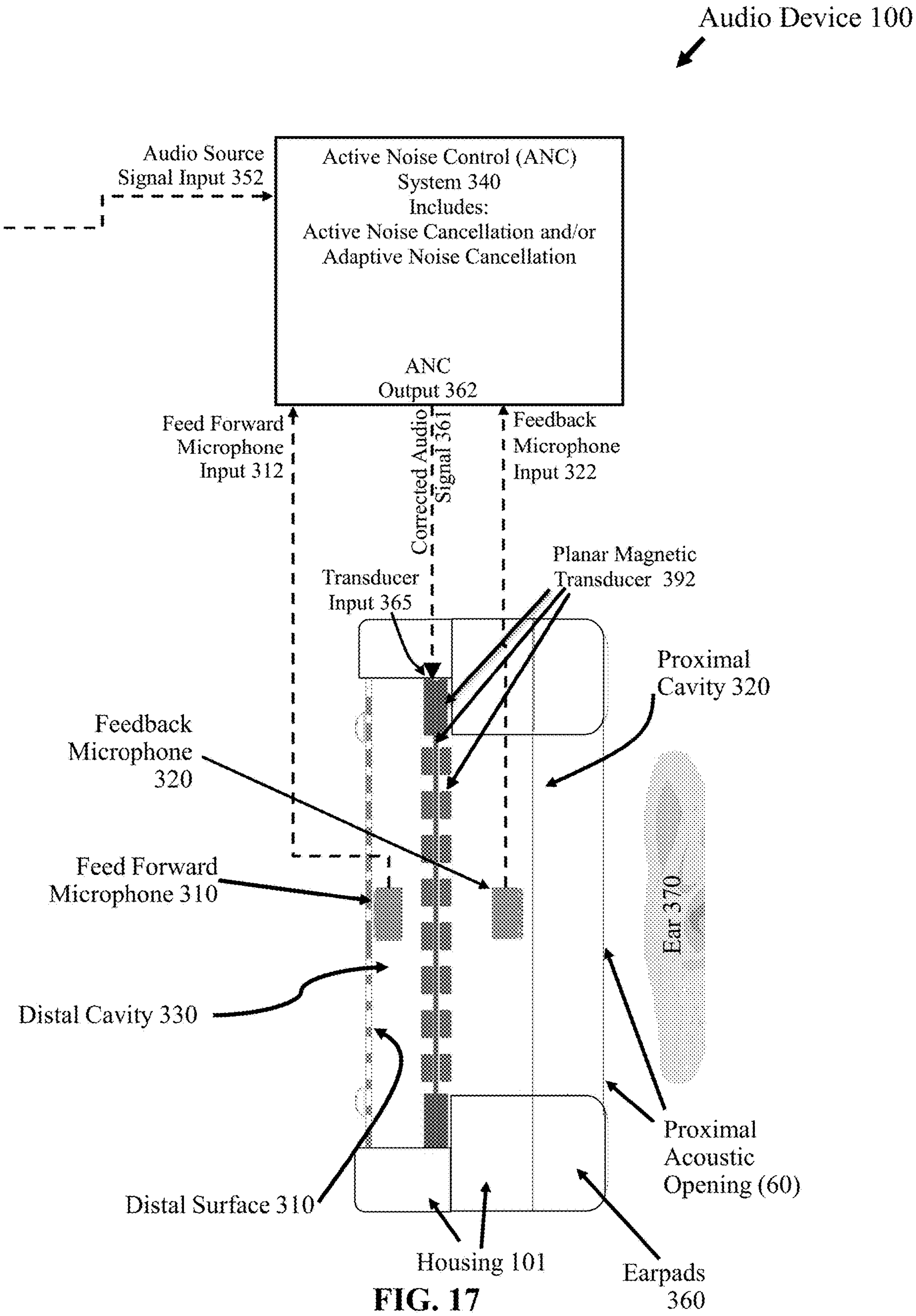

FIG. 17 is a Cross-sectional View of Open-Back Audio Device 100 with Housing (101), Planar Transducer (90), and Active Noise Control System (340).

Figure 18:
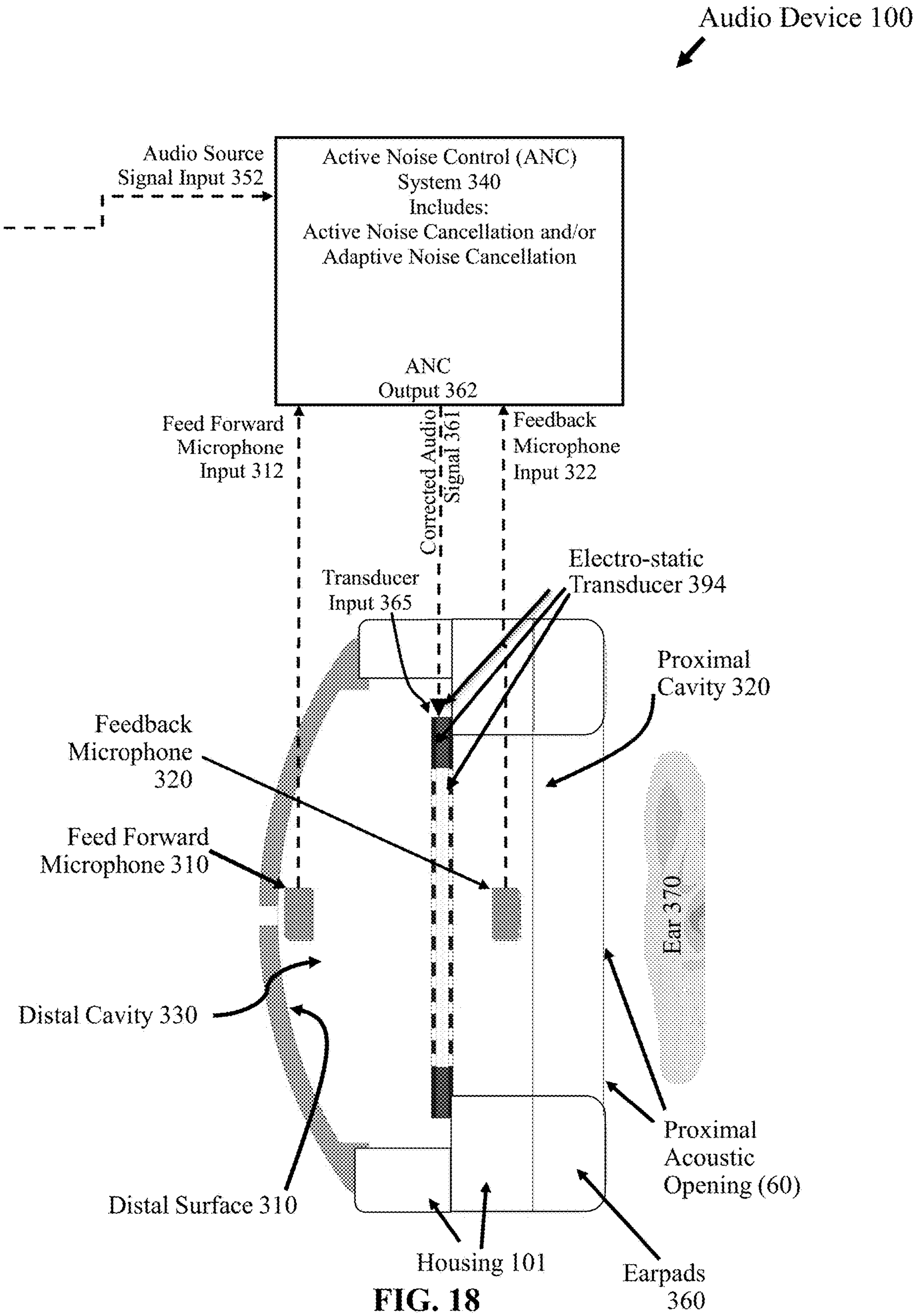

FIG. 18 is a Cross-sectional View of Closed-Back Audio Device 100 with Housing (101), Electro-Static Transducer (394), and Active Noise Control System (340).

Figure 19:
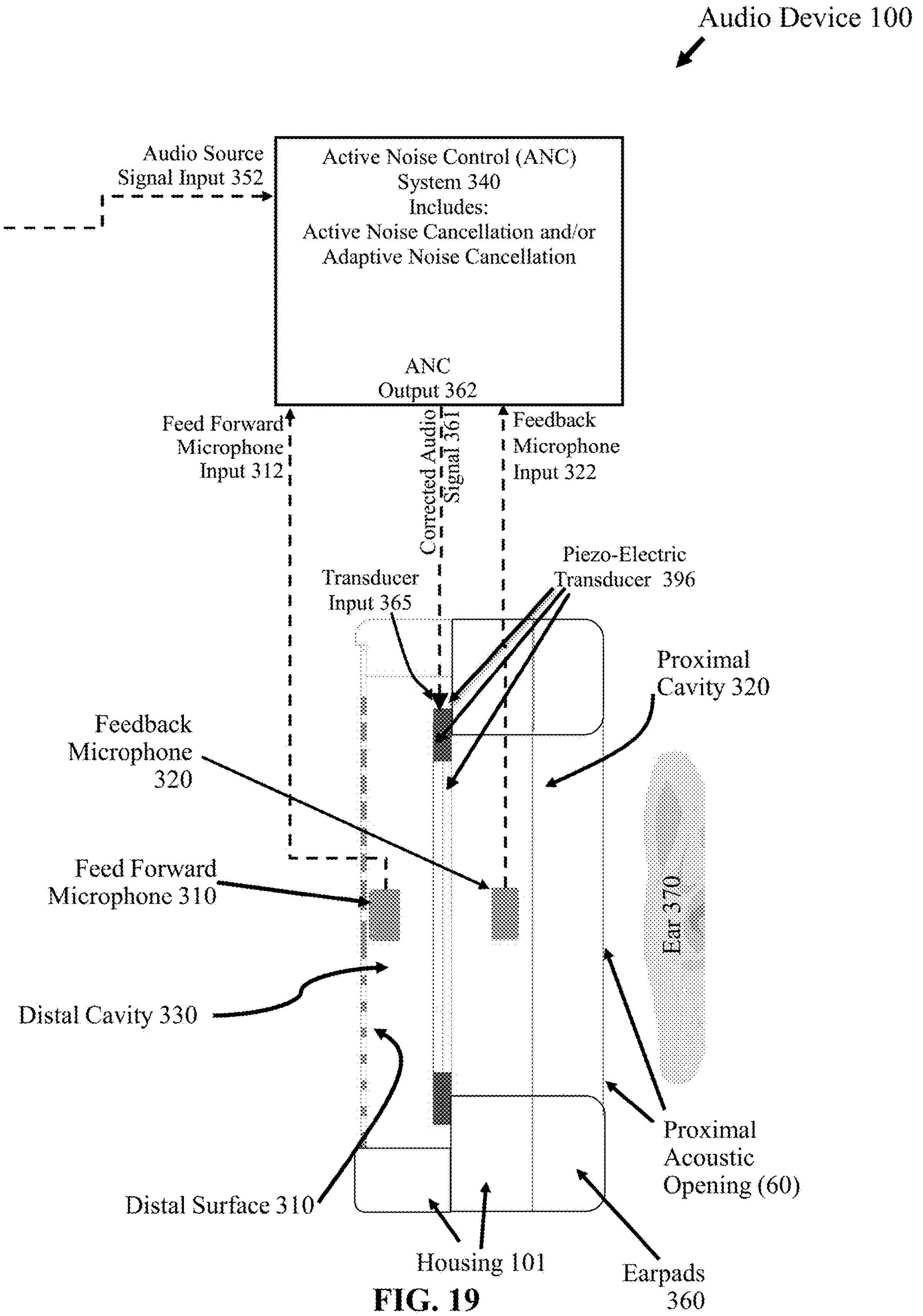

FIG. 19 is a Cross-sectional View of Open-Back Audio Device 100 with Housing (101), Piezo-Electric Transducer (396), and Active Noise Control System (340).

Figure 20:
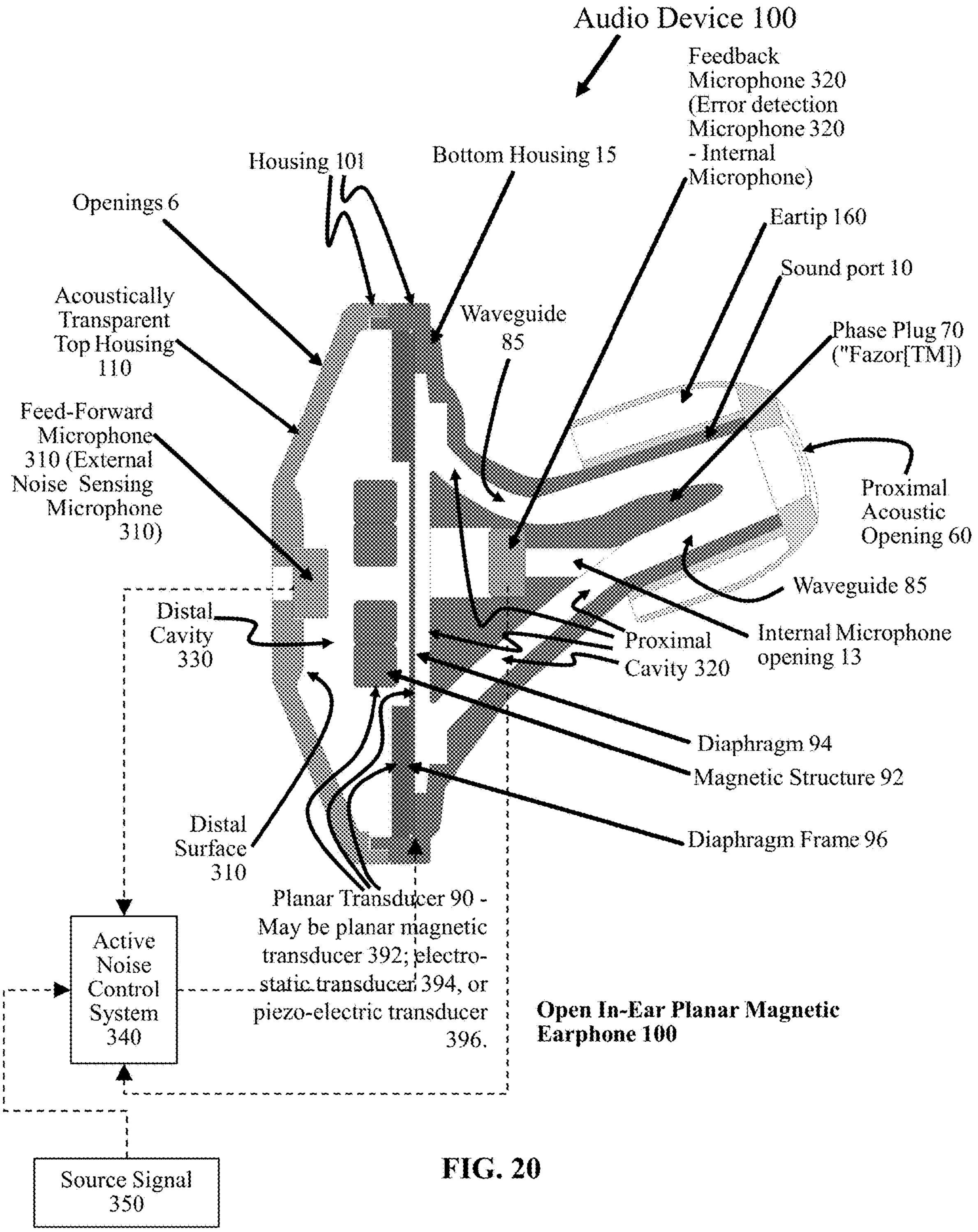

FIG. 20 is a Cross-sectional View of Closed-Back In-Ear Planar Earphone Audio Device 100 with Housing (101), Planar Transducer (90), and Active Noise Control System (340).

Figure 21:
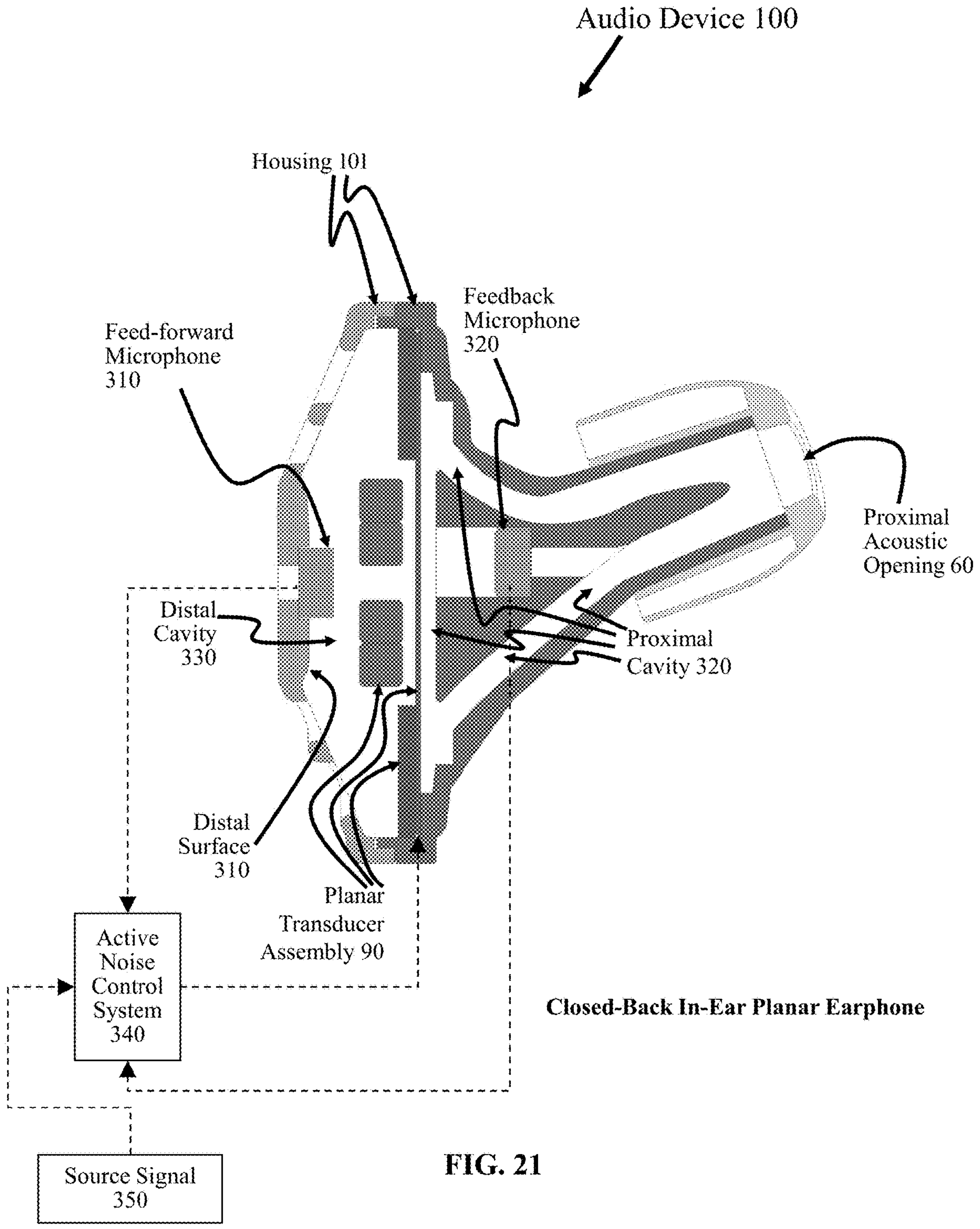

FIG. 21 is a Cross-sectional View of Open-Back In-Ear Planar Magnetic Earphone Audio Device 100 with Housing (101), Planar Transducer (90), and Active Noise Control System (340).

Figure 22:
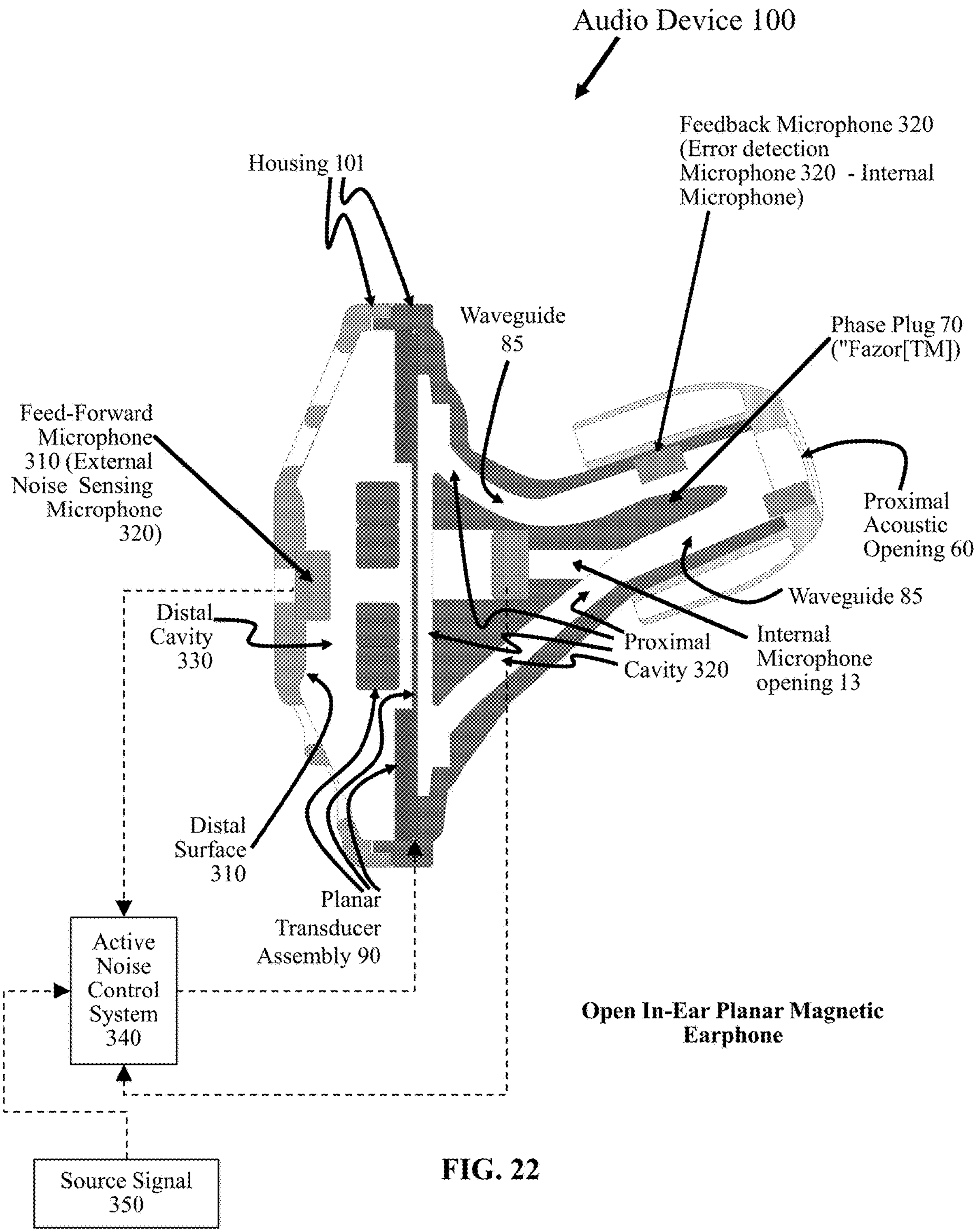

FIG. 22 is a Cross-sectional View of Open-Back In-Ear Planar Earphone Audio Device 100 with Housing (101), Planar Transducer (90), and Active Noise Control System (340).

Figure 23:
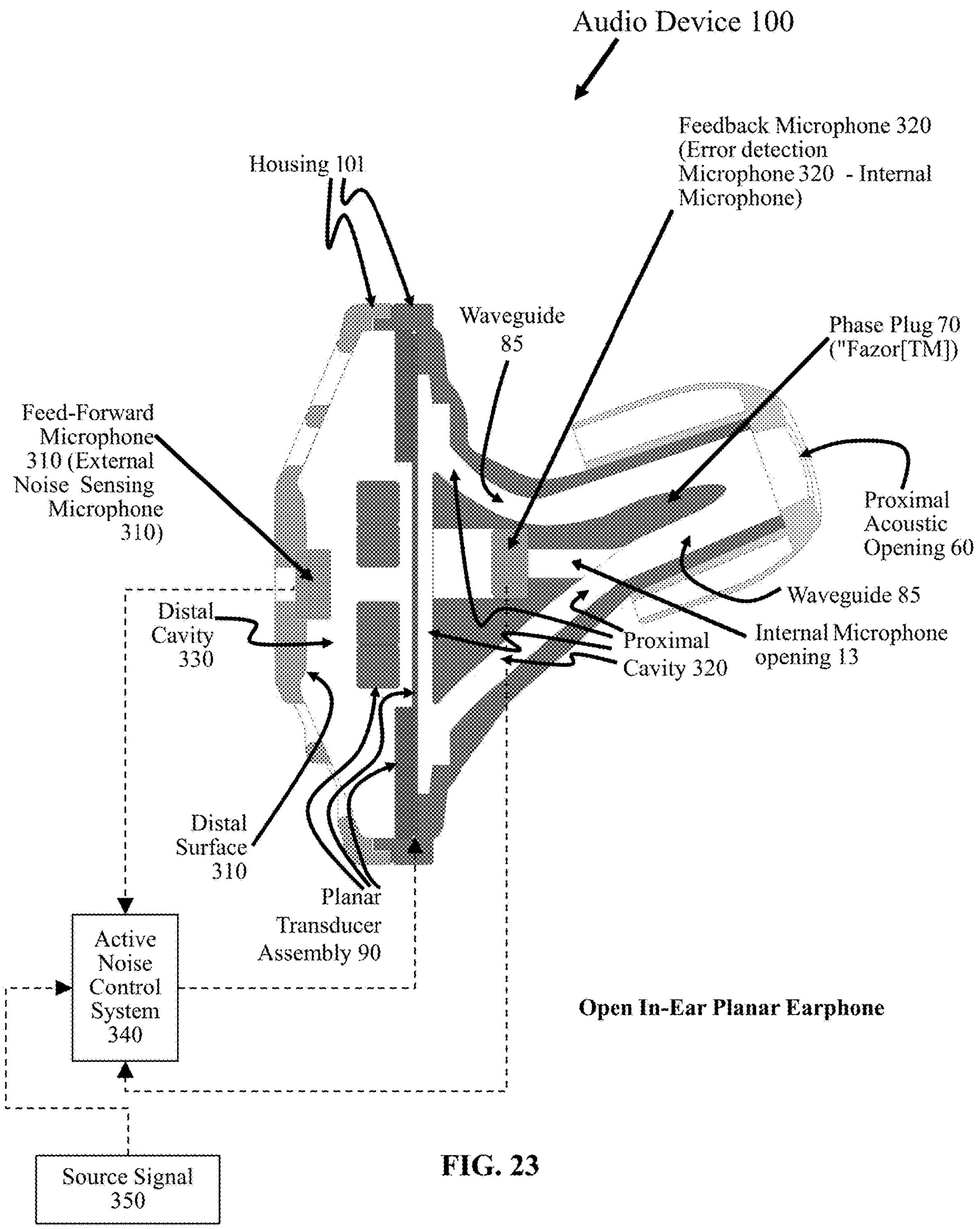

FIG. 23 is a Cross-sectional View of Open-Back In-Ear Planar Earphone Audio Device 100 with Housing (101), Planar Transducer (90), and Active Noise Control System (340).

Figure 24:
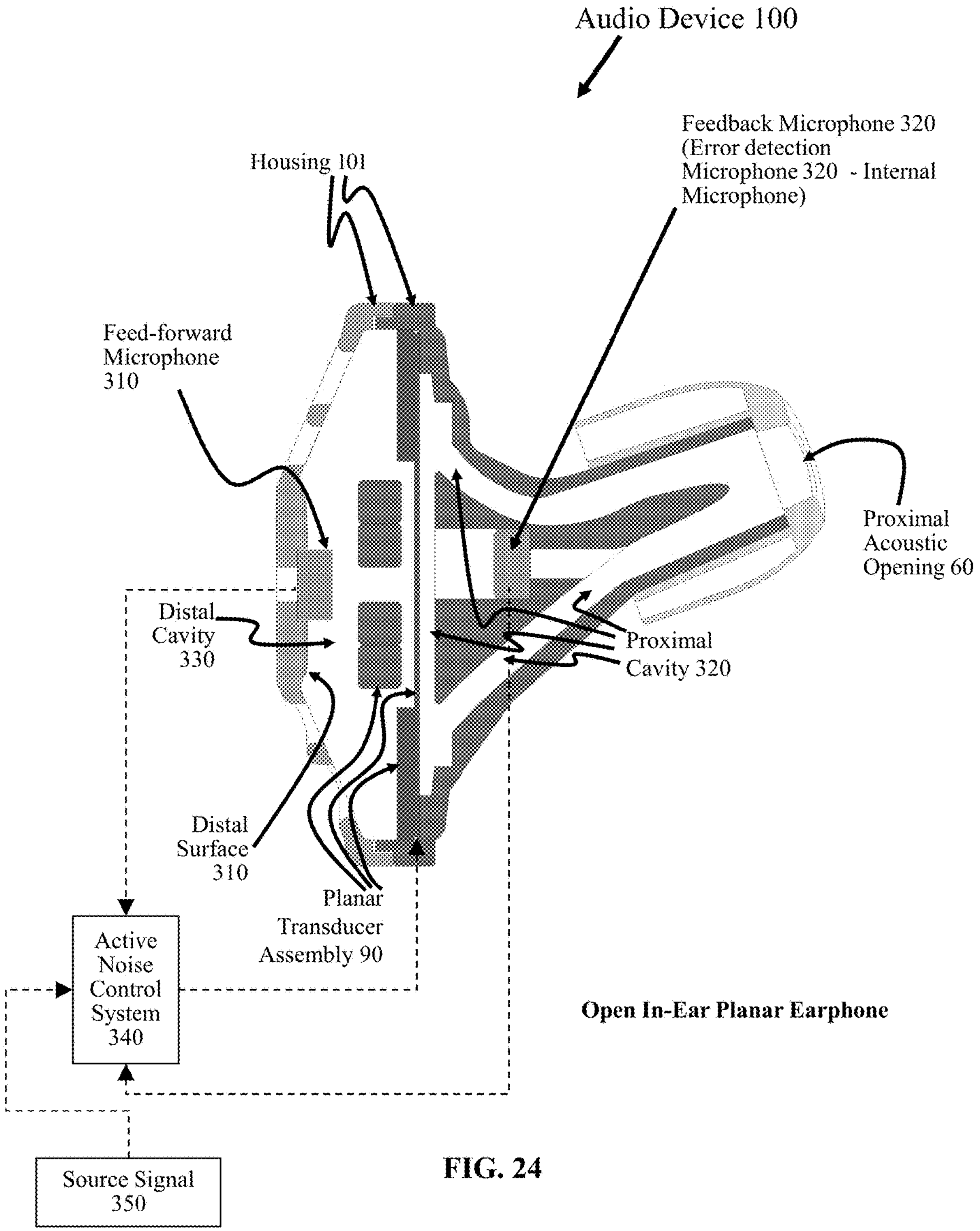

FIG. 24 is a Cross-sectional View of Open-Back In-Ear Planar Magnetic Earphone Audio Device 100 with Housing (101), Planar Transducer (90), and Active Noise Control System (340).

Figure 25:
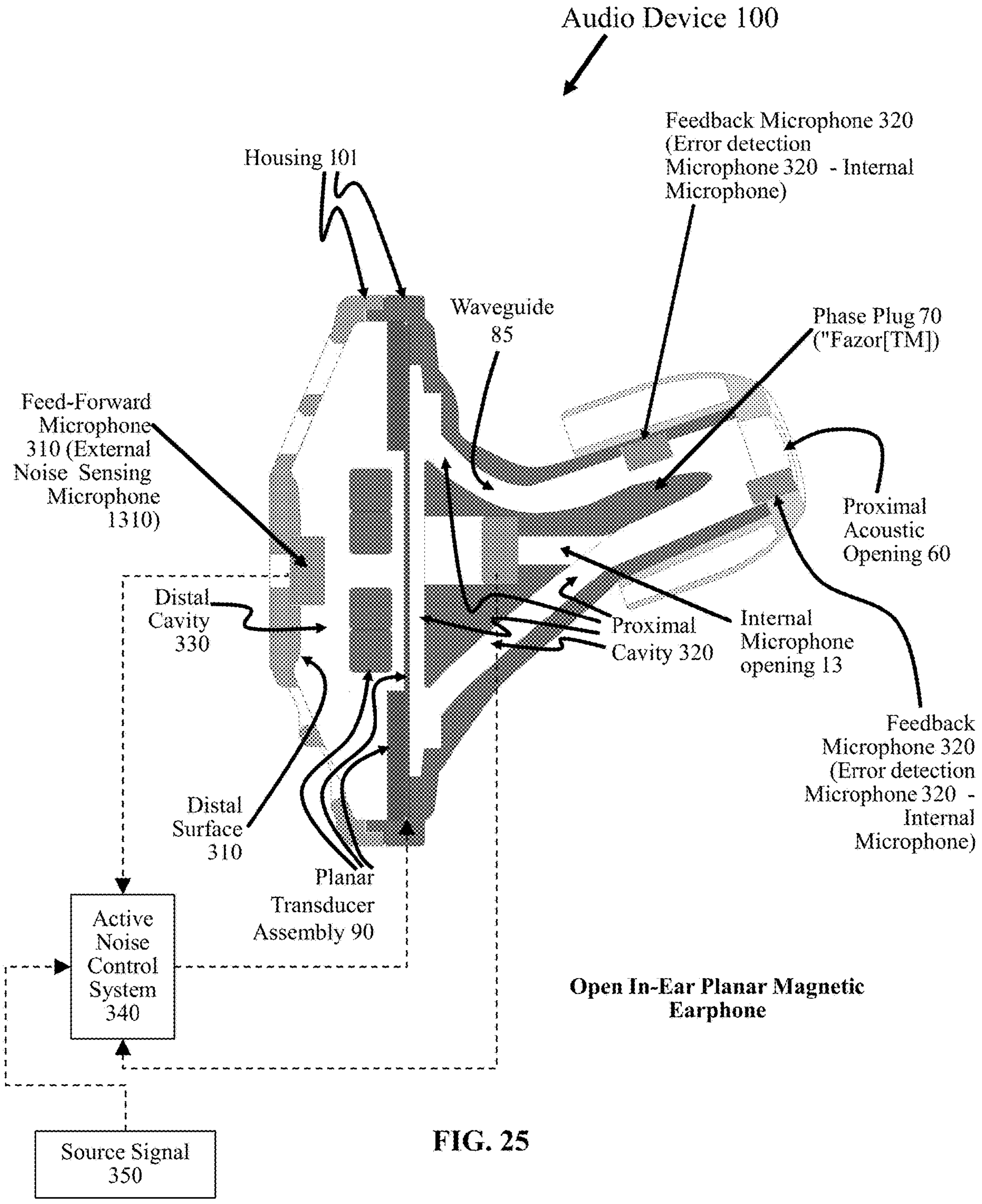

FIG. 25 is a Cross-sectional View of Open-Back In-Ear Planar Magnetic Earphone Audio Device 100 with Housing (101), Planar Transducer (90), and Active Noise Control System (340).

Figure 26:
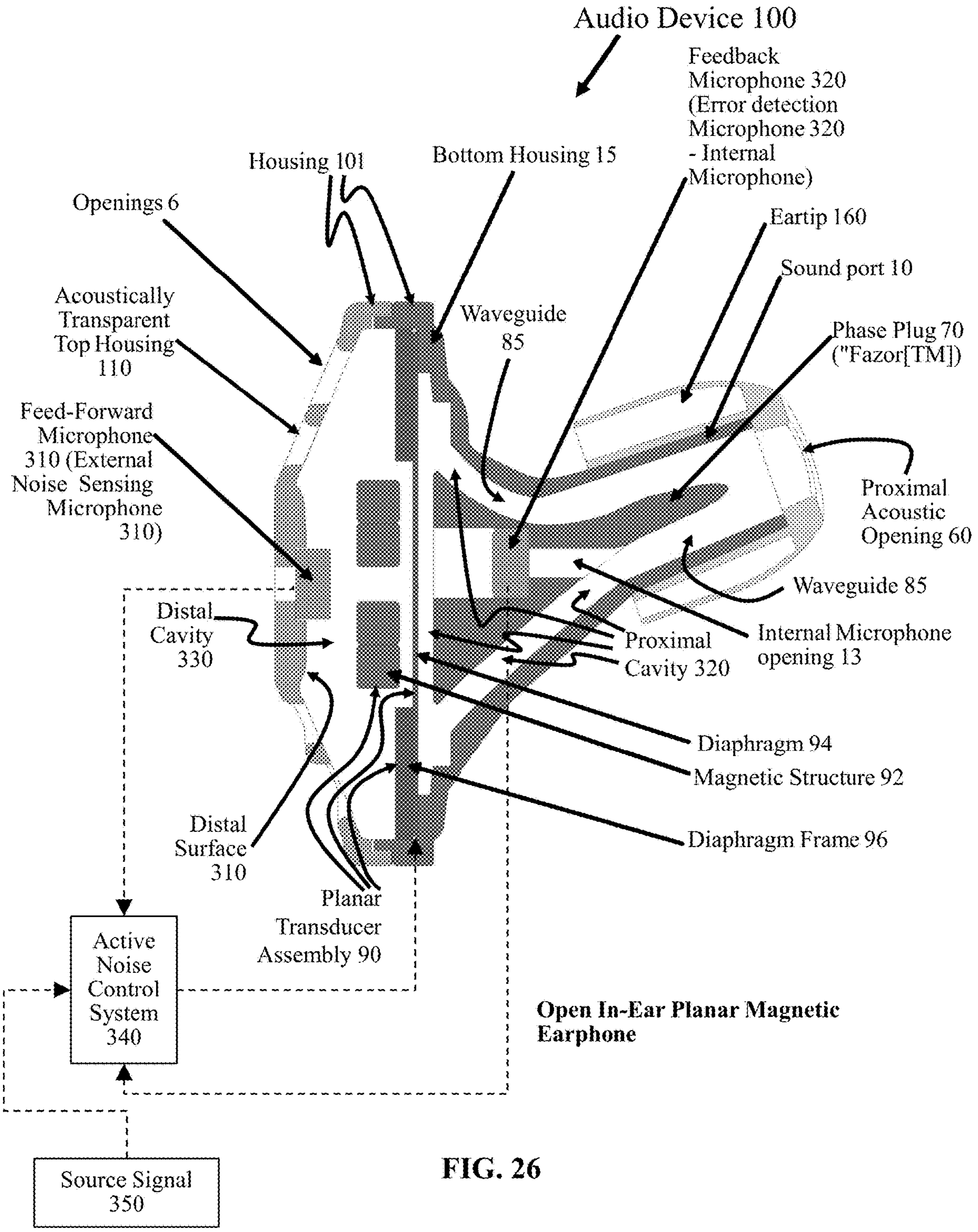

FIG. 26 is a Cross-sectional View of Open-Back In-Ear Planar Magnetic Earphone Audio Device 100 with Housing (101), Planar Transducer (90), and Active Noise Control System (340).

Figure 27:
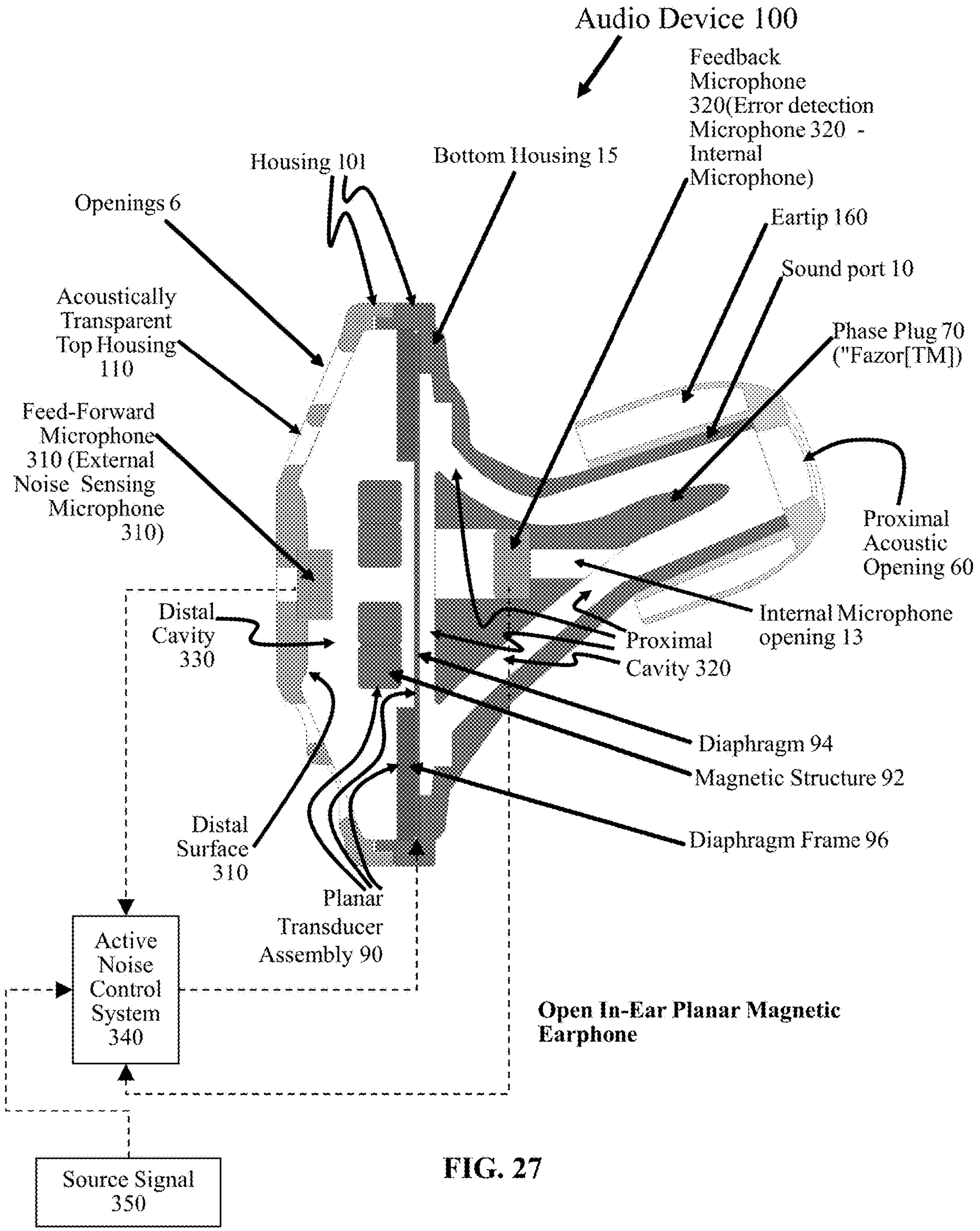

FIG. 27 is a Cross-sectional View of Closed-Back In-Ear Planar Earphone Audio Device 100 with Housing (101), Planar Transducer (90), and Active Noise Control System (340).

Figure 28:
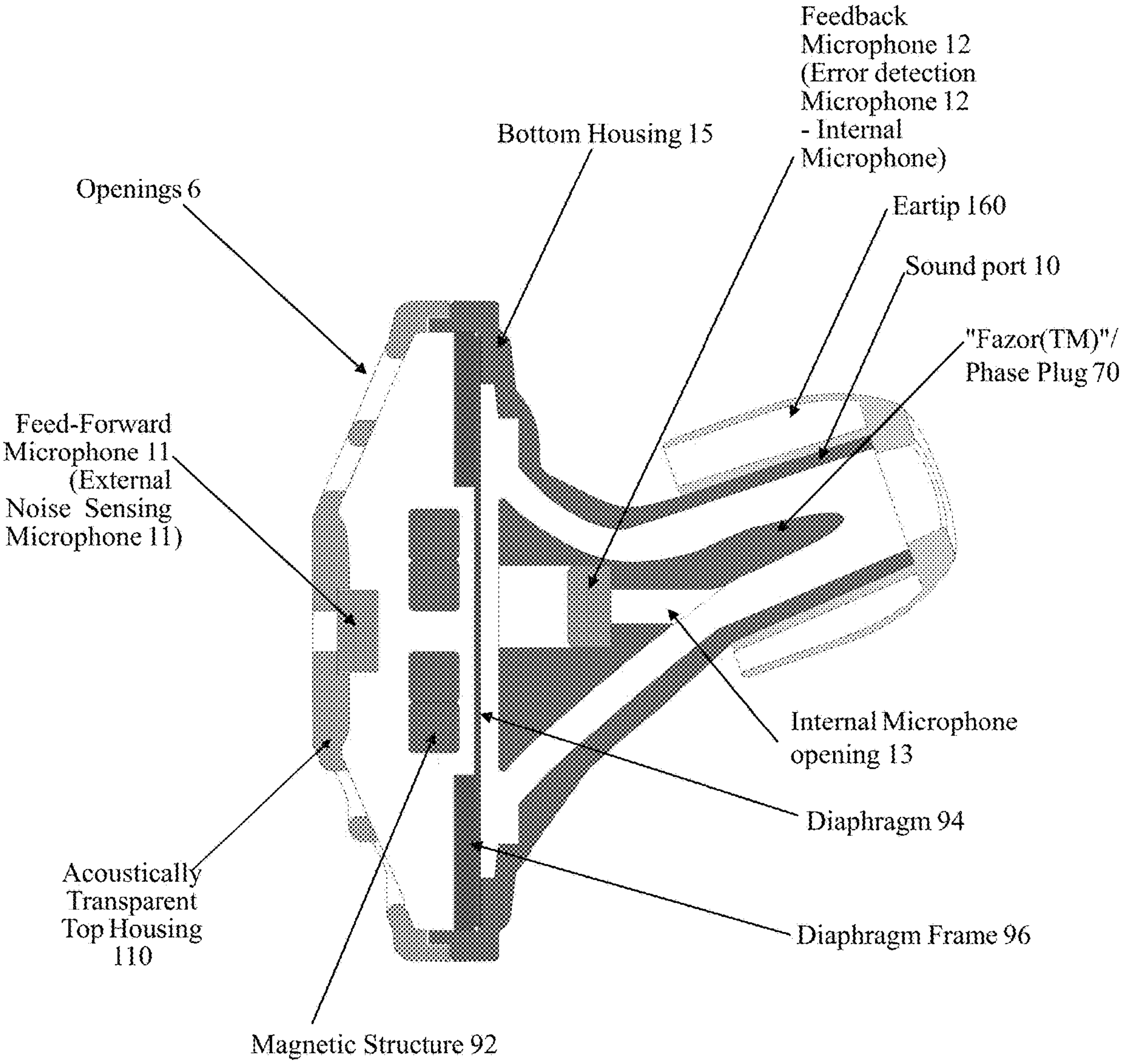

FIG. 28 is a Cross-sectional View of Closed-Back In-Ear Planar Earphone Audio Device 100 with Housing (101), Planar Transducer (90), and Active Noise Control System (340).

Figure 29:
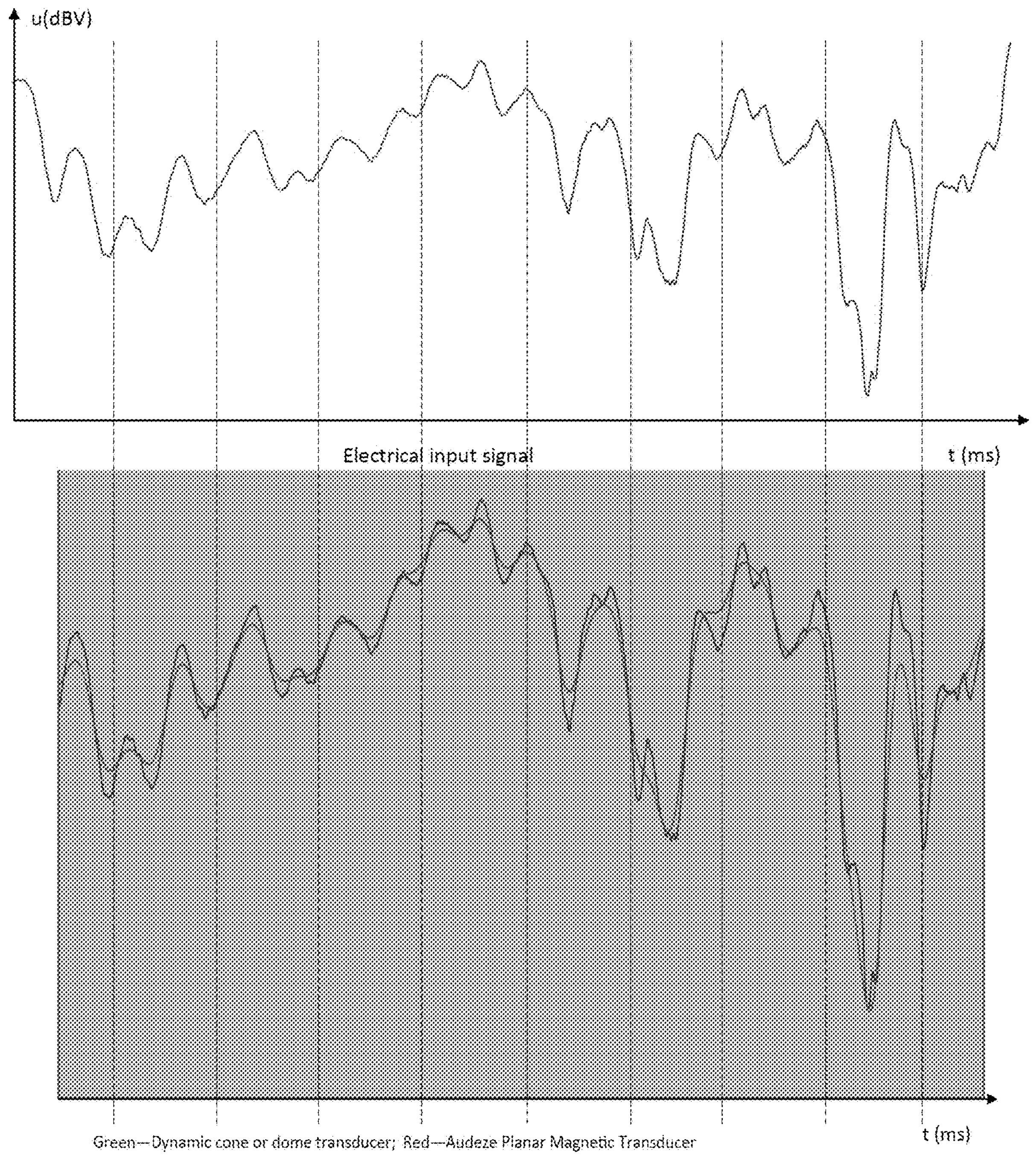

FIG. 29 is a comparison chart between an electrical input signal to two different transducers at the top, and two charts at the bottom showing the SPL sound wave responses for two different types of transducers. The planar transducer at the bottom matches the great detail in the sound wave that almost exactly matches the input signal. The other signal at the bottom is the sound wave response for a voice-coil style transducer with a cone and dome. Notice the distortion with smearing of the high frequencies as one example of voice-coil-style distortion.

Figure 30:
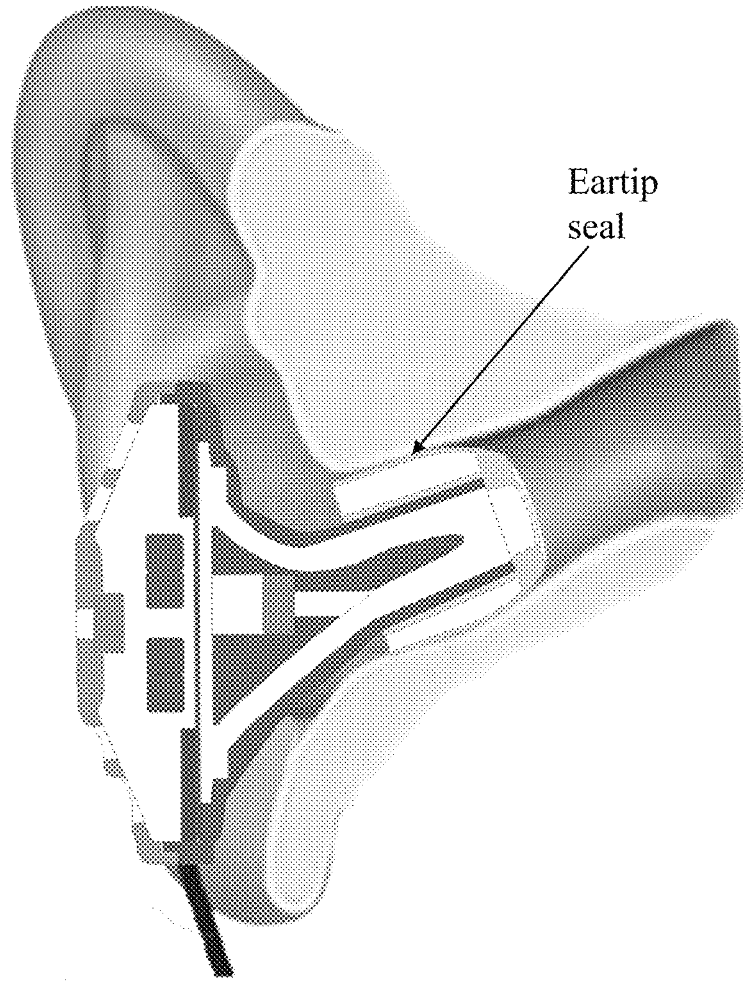

FIG. 30 shows a planar magnetic earphone properly inserted into an ear canal. A proper seal improves low frequency performance.

DETAILED DESCRIPTION

Boilerplate Here

In the Summary above, in this Detailed Description, in the claims below, and in the accompanying drawings, reference is made to particular features (including method steps). It is to be understood that the disclosure in this specification includes all possible combinations of such particular features. For example, where a particular feature is disclosed in the context of a particular aspect or embodiment, or a particular claim, that feature can also be used, to the extent possible, in combination with and/or in the context of other particular aspects and embodiments.

The term "comprises" and grammatical equivalents thereof are used herein to mean that other components, ingredients, steps, etc. are optionally present. For example, an article "comprising" (or "which comprises") components A, B, and C can consist of (i.e., contain only) components A, B, and C, or can contain not only components A, B, and C but also one or more other components. Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number is used herein to denote the end of a range ending with that number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, 25 to 100 mm means a range whose lower limit is 25 mm, and whose upper limit is 100 mm.

Traditionally acoustic devices are comprised of a housing and a transducer or driver disposed in, on, behind, or in some way coupled or affixed to the housing. Traditionally the housing is relatively stationary, while a moving component in the transducer transforms energy (usually electrical) into sound.

Figure 1:
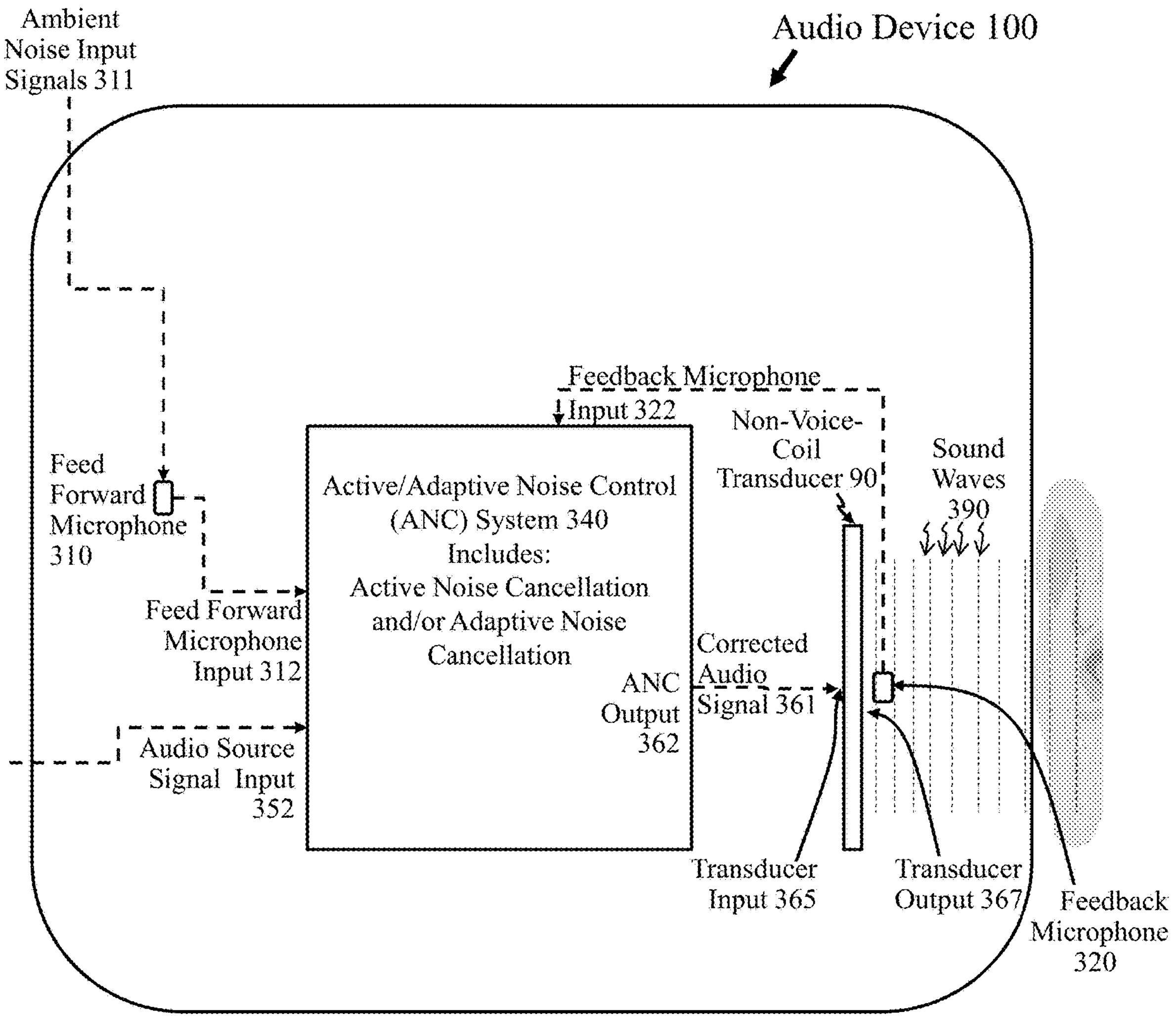
FIG. 1 is an exemplary functional or illustrative schematic view of Audio Device (100) with Active Noise Control System (ANC) (340) including Active and/or Adaptive Noise Control with Audio Source Input (352), ANC Output (362), At Least One Microphone input (312, 322), At Least One Microphone (310, 320), and a Non-Voice-Coil Transducer (90).

FIG. 1 is an exemplary functional or illustrative schematic view of Audio Device (100) with Active Noise Control System (ANC) (340) including Active and/or Adaptive Noise Control with Audio Source Input (352), ANC Output (362), At Least One Microphone input (312, 322), At Least One Microphone (310, 320), and a Non-Voice-Coil Transducer (90).

Figure 2:
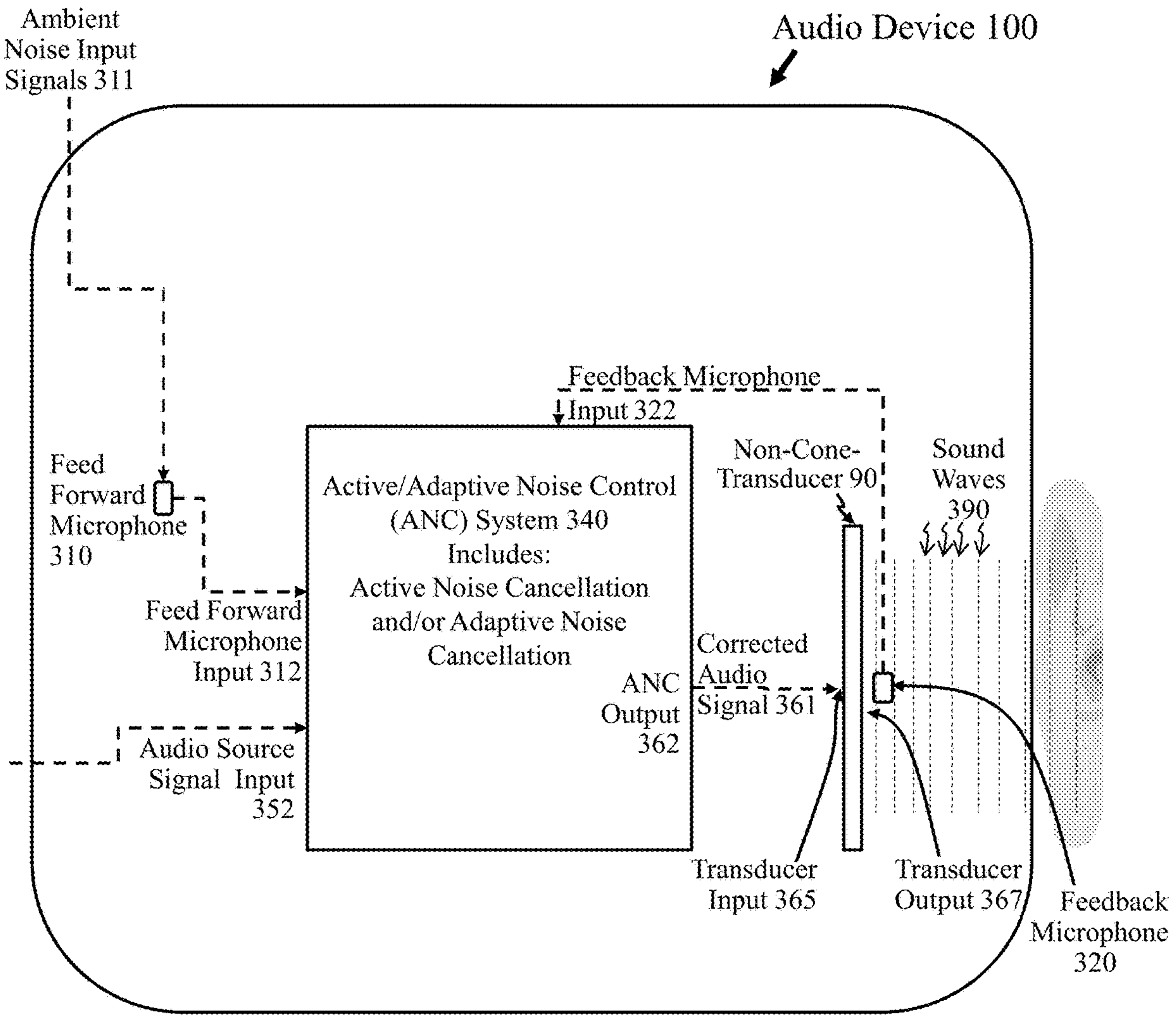
FIG. 2 is an exemplary functional or illustrative schematic view of Audio Device 100 with Active Noise Control System (ANC) (340) including Active and/or Adaptive Noise Control with Audio Source Input (352), ANC Output (362), At Least One Microphone input (312, 322), At Least One Microphone (310, 320), and a Non-Cone Transducer (90).

FIG. 2 is an exemplary functional or illustrative schematic view of Audio Device 100 with Active Noise Control System (ANC) (340) including Active and/or Adaptive Noise Control with Audio Source Input (352), ANC Output (362), At Least One Microphone input (312, 322), At Least One Microphone (310, 320), and a Non-Cone Transducer (90).

Figure 3:
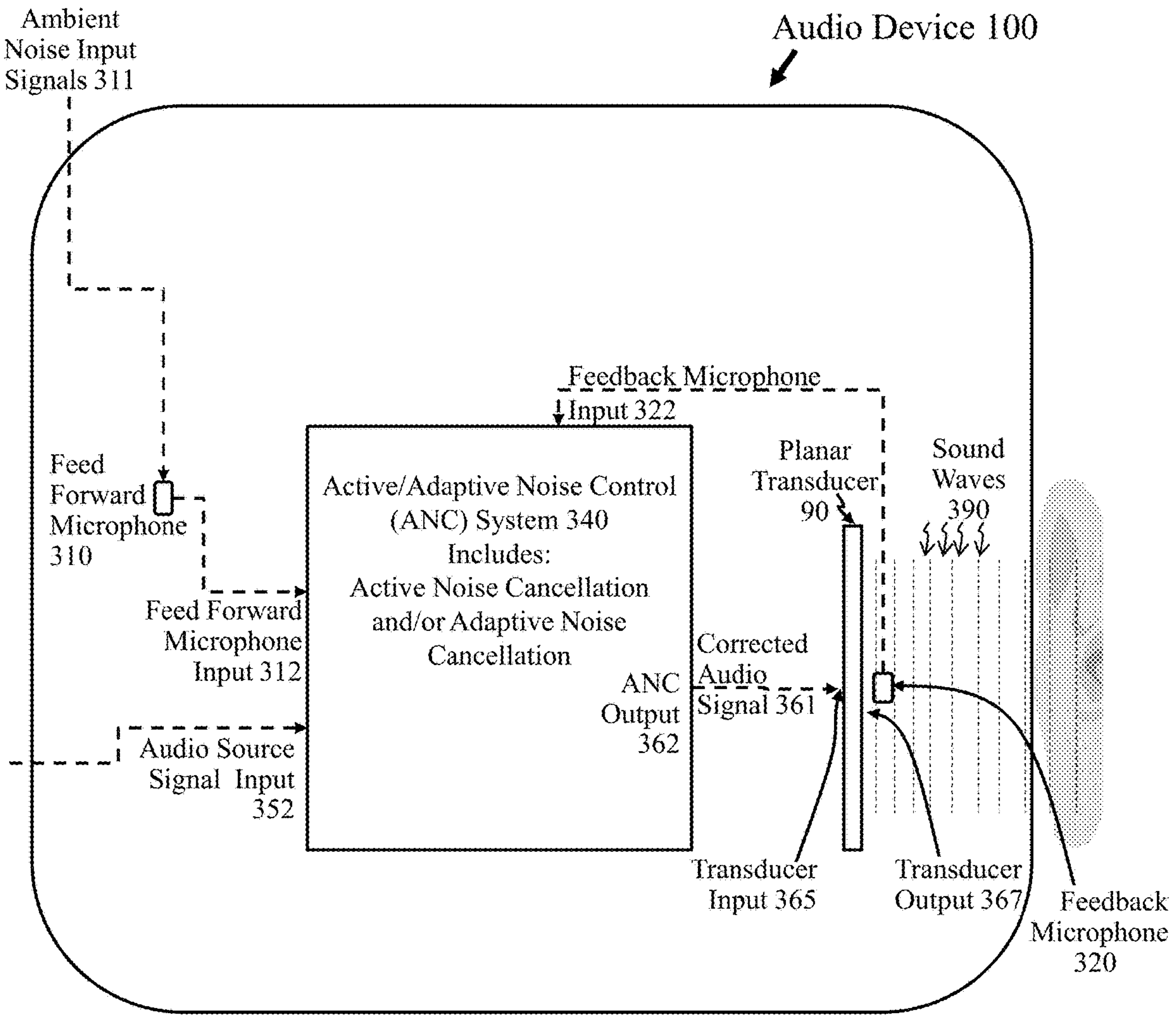
FIG. 3 is an exemplary functional or illustrative schematic view of Audio Device (100) with Active Noise Control System (ANC) (340) including Active and/or Adaptive Noise Control with Audio Source Input (352), ANC Output (362), At Least One Microphone Input (312, 322), At Least One Microphone (310, 320), and a Planar Transducer (90).

FIG. 3 is an exemplary functional or illustrative schematic view of Audio Device (100) with Active Noise Control System (ANC) (340) including Active and/or Adaptive Noise Control with Audio Source Input (352), ANC Output (362), At Least One Microphone Input (312, 322), At Least One Microphone (310, 320), and a Planar Transducer (90).

Figure 4:
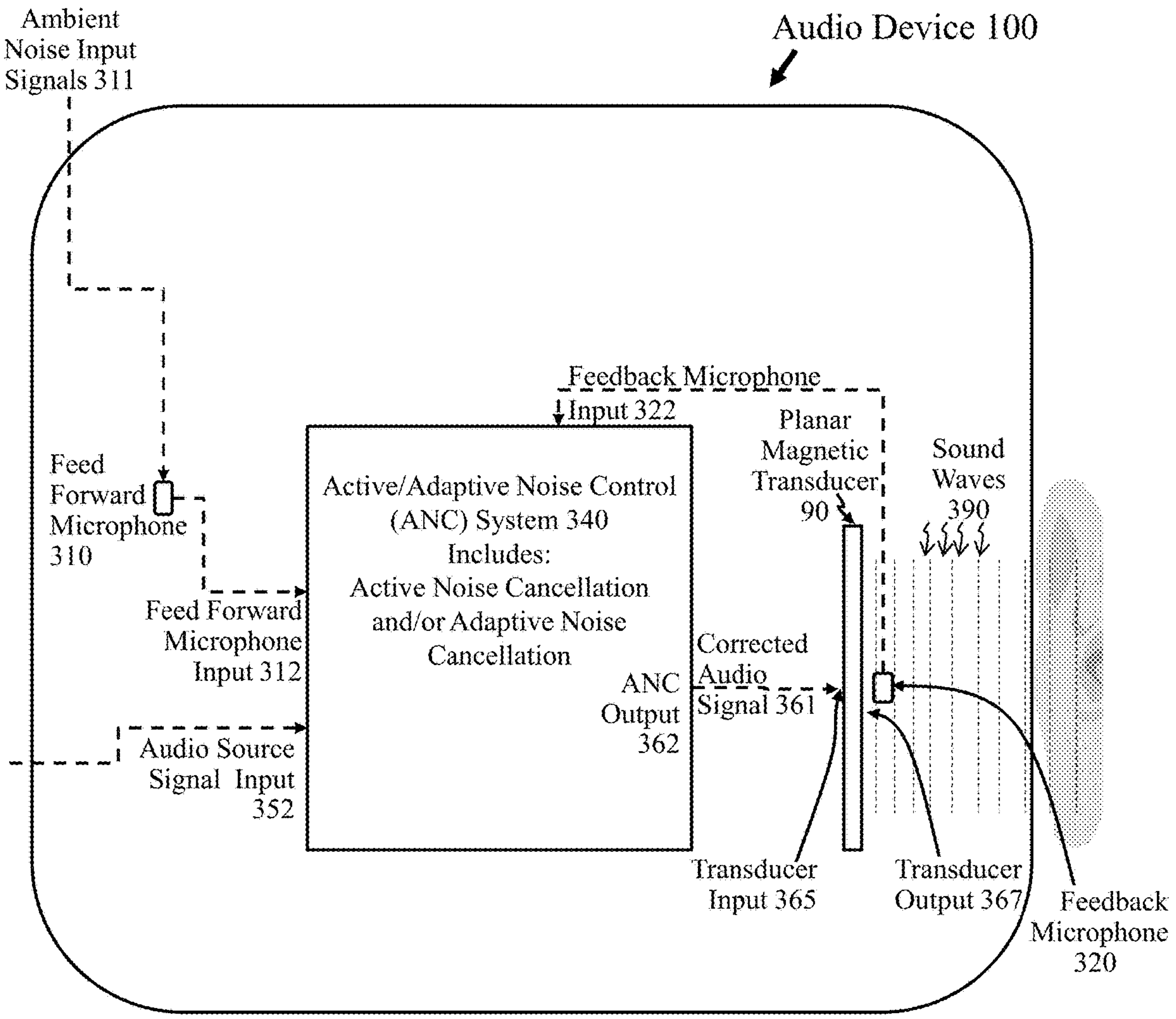
FIG. 4 is an exemplary functional or illustrative schematic view of Audio Device 100 with Active Noise Control System (ANC) (340) including Active and/or Adaptive Noise Control with Audio Source Input (352), ANC Output (362), At Least One Microphone Input (312, 322), At Least One Microphone (310, 320), and a Planar Magnetic Transducer (90).

FIG. 4 is an exemplary functional or illustrative schematic view of Audio Device 100 with Active Noise Control System (ANC) (340) including Active and/or Adaptive Noise Control with Audio Source Input (352), ANC Output (362), At Least One Microphone Input (312, 322), At Least One Microphone (310, 320), and a Planar Magnetic Transducer (90).

FIG. 5 is an exemplary functional or illustrative schematic of reducing time delay from the diaphragm to the microphone by embedding the microphone on the diaphragm of the transducer itself. FIG. 5 shows a Hybrid Feed-Forward-Feedback Audio Device 100 with Active Noise Control System (ANC) (340) including Active and/or Adaptive Noise Control with Audio Source Input (352), ANC Output (362), At least one Microphone (310, 320), at least One Microphone Input (312, 322), Audio Source Input (352), ANC Output (362), and a Non-Voice-Coil Transducer (90).

FIG. 5 Includes a diaphragm (94) including an electromechanical system (325) for converting the input (365) into the output (367) for providing sound waves (390), and a mechano-electrical system (326) coupled to the diaphragm (94) having a mechano-electrical output (327) such that motion of sound waves (390) impacting the diaphragm (94) generates a proportionate mechano-electrical output signal (328), wherein the mechano-electrical system (326) acts as the at least one microphone (310, 320) connected to the at least one microphone input (312, 322).

FIG. 6 is an exemplary functional or illustrative schematic view of diaphragm trace pattern with 2 separate circuits. Dual loop main circuit carries the current from the amplifier which interacts with magnetic field and moves diaphragm back and forth creating sound. Movement of the diaphragm causes a small voltage to be induced in a second circuit which can be used as a feedback signal for ANC.

FIG. 7 is an exemplary functional or illustrative schematic view of Feed-Forward Audio Device 100 with Active Noise Control System (ANC) (340) including Active and/or Adaptive Noise Control with Audio Source Input (352), ANC Output (362), Feed Forward Microphone (310), Audio Source Input (352), ANC Output (362), and a Non-Voice-Coil Transducer (90).

FIG. 8 is an exemplary functional or illustrative schematic view of Feedback Audio Device 100 with Active Noise Control System (ANC) (340) including Active and/or Adaptive Noise Control with Audio Source Input (352), ANC Output (362), Feedback Microphone (320), Feedback Microphone Input (322), and a Non-Voice-Coil Transducer (90).

FIG. 9 is an exemplary functional or illustrative schematic view of Audio Device (100) with Active Noise Control System (ANC) (340) including Active and/or Adaptive Noise Control with of Hybrid Feedforward-Feedback Audio Device 100 with Active Noise Control System (ANC) (340) including Active and/or Adaptive Noise Control with Audio Source Input (352), ANC Output (362), Microphone inputs (312, 322), Microphones (310, 320), and a Non-Voice-Coil Transducer (90).

FIG. 10 is an exemplary functional or illustrative schematic view of Audio Device 100 with Active Noise Control System (ANC) (340) including Active and/or Adaptive Noise Control with Audio Source Input (352), ANC Output (362), At Least One Microphone input (312, 322), At Least One Microphone (310, 320), and a Non-Voice-Coil Transducer (90).

FIG. 11 is an exemplary functional or illustrative schematic view of Audio Device (100) with Active Noise Control System (ANC) (340) including Active and/or Adaptive Noise Control withof Audio Device 100 with Active Noise Control System (ANC) (340) including Analog and/or Digital Control System with Audio Source Input (352), ANC Output (362), At Least One Microphone input (312, 322), At Least One Microphone (310, 320), and a Non-Voice-Coil Transducer (90).

FIG. 12 is a Cross-sectional View of Closed-Back Audio Device 100 with Housing (101), Planar Transducer (90), and Active Noise Control System (340).

FIG. 13 is a Cross-sectional View of Closed-Back Audio Device 100 with Housing (101), Planar Transducer (90), and Active Noise Control System (340).

FIG. 14 is a Cross-sectional View of Closed-Back Audio Device 100 with Housing (101), Planar Transducer (90), and Active Noise Control System (340).

FIG. 15 is a Cross-sectional View of Open-Back Audio Device 100 with Housing (101), Planar Transducer (90), and Active Noise Control System (340).

FIG. 16 is a Cross-sectional View of Open-Back Audio Device 100 with acoustically absorbent material (33) in Housing (101), Planar Transducer (90), and Active Noise Control System (340).

FIG. 17 is a Cross-sectional View of Open-Back Audio Device 100 with Housing (101), Planar Transducer (90), and Active Noise Control System (340).

FIG. 18 is a Cross-sectional View of Closed-Back Audio Device 100 with Housing (101), Electro-Static Transducer (394), and Active Noise Control System (340).

FIG. 19 is a Cross-sectional View of Open-Back Audio Device 100 with Housing (101), Piezo-Electric Transducer (396), and Active Noise Control System (340).

FIG. 20 is a Cross-sectional View of Closed-Back In-Ear Planar Earphone Audio Device 100 with Housing (101), Planar Transducer (90), and Active Noise Control System (340).

FIG. 20 shows a cross-sectional illustrative view of one aspect of the present invention showing an in-ear planar magnetic earphone (100) with an open-back configuration and active noise cancellation. FIG. 20 shows a housing 101 which may be a singular housing 101, or it may comprise multiple components to construct the housing 101. As an example, FIG. 1 shows housing 101 comprising a bottom housing 15 and a top housing 110. In other embodiments, the housing 101 may not be shaped similarly to the housing 101 as shown in FIG. 1. FIG. 1 shows the bottom housing 15, part of which becomes the sound port 10 approximately at the point where the bottom housing 15 fits into the ear canal (as shown in FIG. 28). The sound port 10 may be encompassed by an eartip 160 when placed into the ear canal. The eartip 160 is made of a soft flexible material such as foam, expanding foam, rubber, silicone, or similar material. This helps make the device comfortable in the ear and helps to create a seal around the eartip 160 such that no undesired air gap exists from the ear canal to the outside air caused by an inadequate fit between the eartip 160 and the ear canal. Eartips may be of various sizes to fit relatively snuggly into the ears of different people with different diameter ear canals.

Alternatively, instead of an eartip 160, the sound port 10 can be designed to exclusively fit a specific person's ears (not shown). Creating a mold of a specific person's ear canal to design a custom-fitted earphone, sound port, or eartip is well known in the earphone industry. A sound port 10 may be designed exclusively to be fitted to a specific person's ear so that the sound port may be even longer than shown in FIG. 20 and optionally fit deeper into that fitted person's ear such that a good seal is formed between the air in the ear canal and the outside air.

With this approach, the sound port 10 may be made to be removable from the bottom housing 15 such that different people can remove and attach the same earphone 15 with their own exclusively fitted sound port 10.

In FIG. 20, coupled to the bottom housing 15 is an acoustically transparent top housing 110. This acoustically transparent top housing 110 includes acoustically transparent openings 6. The acoustically transparent top housing 110 is the reason the earphone 15 is called "open" or "open-backed". In this case, the ANC causes effective external noise reduction while still preserving the sensation of an open space, thus avoiding the unnatural occlusion effect of closed-back earphones or headphones.

If the space between the diaphragm and top housing is filled with acoustically absorptive material the design is considered to be "semi-open" or "semi-open-backed" (not shown). This semi-open-backed design may be used with all of the planar types of transducers, as later described in FIG. 3, FIG. 5, and other open-backed headphones and earphones. Both the "semi-open" and "semi-open-backed" approaches equalize the back-pressure with the outside air and also preserve the sensation of an open space, avoiding the unnatural occlusion effect of closed-back earphones or headphones.

Positioned on the bottom housing 15 or on the top housing 110 is diaphragm frame 96. In this planar magnetic earphone (100), the diaphragm frame 96 is a planar magnetic diaphragm frame 96. Suspended in the diaphragm frame 96 is a planar diaphragm 94. The planar diaphragm 94 is a light thin film held to a desired tautness by the diaphragm frame 96.

A magnetic structure 92 is disposed on one or both sides of the diaphragm 94, wherein the magnetic structure 92 is held in place by a magnetic frame or mount (not shown). Here the magnetic structure 92 is only shown on one side of the diaphragm to reduce drawing clutter on the page. In actual practice, magnetic structures 92 may be placed on both sides of the diaphragm 94.

Note that in FIG. 20 of the active noise-controlled earphone, the magnetic structure 92 and diaphragm 94 are illustratively shown as a planar magnet array for a planar magnet array transducer. In practice, other planar transducers and diaphragms may be used, such as electrostatic transducers, piezoelectric transducers, AMT (air Motion Transformer), thin rigid diaphragm planar transducer or other planar transducers. In addition, other types of transducers may be used, such as dynamic transducers.

Planar diaphragm 94 has electrical conductors (not shown) disposed on one or both sides of the planar diaphragm 94. These conductors form at least one electrical circuit (not shown). When an electrical signal for sound is transmitted through the electrical conductors, the diaphragm 94 is attracted to or repelled by the magnets in the magnetic structure 92 to create an acoustic signal. The arrangement of the magnets (not shown) in magnetic structure 92 and the arrangement of the conductors (not shown) on diaphragm 94 are variously selected to optimize the magnetic and electrical interaction required to achieve the earphone 15 designer's goals.

External noise sensing microphone 11 is disposed on acoustically transparent top housing 110 such that external noise or sounds from the environment will be sensed by external noise sensing microphone 11 and converted into electrical signals corresponding to the noise. These signals are carried on conductors (not shown) to an active noise cancellation processor (not shown). In processing, the anti-noise signal (equal amplitude, inverse of the noise signal) may be delayed in time and then is added to or subtracted from the original sound signal. It is then transmitted to the diaphragm 94, where the noise and anti-noise cancel each other, such that only the original source signal is emitted from the diaphragm 94 and into the bottom housing 15 and sound port 10. This operation where external noise sensing microphone 11 is in front of the diaphragm 94 is termed forward active noise cancellation or feed-forward ANC.

It is important to note that FIG. 20 is an illustrative drawing with the external noise sensing microphone 11 illustratively placed immediately inside the acoustically transparent housing 110 at the center. In fact, the external noise sensing microphone 11 is not limited to where it may be placed. It may be placed anywhere inside, outside, or mounted flush with the surface of the external noise sensing microphone 11. Here the term "external" is used because the microphone 11 is capturing noise and sounds outside of or external to the earphone (100). Thus, an external noise sensing microphone 11 could be mounted anywhere "inside" the cavity formed between the top housing 110, the diaphragm 94 and diaphragm frame 96, which we will call the "outside cavity". Likewise, the external noise sensing microphone 11 could be mounted anywhere outside the top housing 110, or flush with the top housing 110. Thus, the present invention is not limited strictly to the placement of the external noise sensing microphone 11. Instead, the placement of the external noise sensing microphone 11 may be varied to achieve certain acoustical results.

Further, there may be more than one external noise sensing microphone 11. These multiple external noise sensing microphones 11 again may be place wherever they need to be to achieve certain acoustical results.

Continuing with FIG. 20, inside the of the cavity formed between the bottom housing 15, the sound port 10, and the diaphragm 94 (called the "inside" cavity) is disposed a uniquely designed illustratively shown phase plug 70 [also described as a phase shifting element, phase-shift plug, phase plug, phase controlling element, or commercially named Fazor™ 70]. This phase plug 70 may be inserted into or molded on the bottom housing 15. The phase plug 70 may be formed in various shapes to affect the acoustical properties of the device. These acoustical properties may comprise phasing and phase-shifting, decreased sound diffraction, improved acoustic loading, improved reflection characteristics, and decreased sound distortion. By varying the shape and placement of the phase-shifting element 70 within the internal cavity (which we will call the "inside cavity" or "inside chamber") in the bottom housing 15, we can change the acoustical properties of the device. The change in shape of at least one waveguide between the phase-shifting element 70 and the inside surface of the bottom housing 15 will enable finely controllable acoustic properties. The internal phase-shifting element 70 is not limited to a single instance, as there may be multiple internal phase-shifting elements 70 within the inside cavity [not shown]. The internal phase-shifting element 70 is also not limited to being in the center of the inside cavity. The phase-shifting element 70 may be held in place in various ways, such as being attached to the bottom housing 15 with one or more spokes, attached directly to the inside surface of the bottom housing 15, or any other ways known in the attachment art.

This phase plug 70 serves several other purposes such as maintaining phase coherence, decreasing reflections, increasing compression, and increasing the pressure wave to the output of the sound port 10. The phase plug 70 is described more fully in other patents.

FIG. 20 also shows an illustrative example of an ear tip 160. The ear tip 160 may comprise a soft material that is as sound proof as possible while fitting snuggly in the ear canal and creating a good sound seal.

In the inside cavity, FIG. 20 shows the phase plug 70 with an error detection microphone 12 inserted into the phase plug 70. As shown in FIG. 20, for illustrative purposes, the error detection microphone 12 is placed in a hollowed-out hole in the phase plug 70. On the other side of the internal microphone 12 is an internal microphone opening 13 nearer the ear. This allows the sound waves to flow through the "tunnel", instead of causing interference should the sound waves reflect back toward the diaphragm 94.

The error detection internal microphone 12 is used to receive both the original electrical sound signal transmitted to the diaphragm plus any external noise that has penetrated the inside chamber. This summed signal is sent to a processor to generate the required signal to do ANC.

In at least one embodiment of the present invention, the "tunnel" through the phase plug 70, in which the internal microphone 12 is placed and where the internal microphone opening 13 exists, is a straight path "tunnel" as is shown illustratively in FIG. 20. In at least one embodiment of the present invention, the "tunnel" through the phase plug 70, in which the internal microphone 12 is placed, and the internal microphone opening 13 exists, is not a straight path "tunnel" as is shown illustratively in FIG. 20. In at least one embodiment of the present invention, the "tunnel" through the phase plug 70, may wind around inside the phase plug 70 such that the length (and hence time delay) of the tunnel matches the length (and time delay) of the waveguides formed between the phase plug 70 and the bottom housing 15. This enables phase coherence not only around the phase plug 70, but also through the phase plug 70 "tunnel".

As stated previously, FIG. 20 is illustrative. Thus, error detection (internal microphone) 12 may be located anywhere in the inside cavity. Error detection (internal microphone) 12 may be mounted on an external surface of the phase plug 70, or on an internal surface of the bottom housing 15. Error detection (internal microphone) 12 may be attached on the outside of these surfaces, mounted flush on the surface, or burrowed into a hole in the surface. An illustrative example of being burrowed into a surface (in this case, in phase plug 70) is shown in FIG. 20 where error detection (internal microphone) 12 is "burrowed" into a hole in phase plug 70.

Further, the present invention is not limited to a single microphone in either cavity. Multiple microphones can be used in any location for varying acoustical effects and noise cancellation.

Since FIG. 20 is an illustrative example of the present invention, it should be understood there are many variations of the present invention (not shown) that are encompassed within the present invention.

For larger circumaural designs (over-the-ear, with the headphones completely enclosing the ears), or supra-aural designs (on-the-ear headphones), the larger size of the planar drivers (or other drivers) may comprise multiple feedback and feed-forward microphones. These may be combined with processors or multi-processors, including digital signal processors (DSPs) such that multiple inputs may be treated by the processor or processors in an algorithmic manner to achieve highly accurate estimates of error signals, thus improving noise cancellation. A simple example of this might be summing the inputs in a weighted fashion, but any other simple to highly sophisticated algorithm may be used to achieve maximal, optimal, or desired noise cancellation.

In addition, for circumaural or supra-aural planar headphones incorporating planar transducers, (including but not limited to planar magnetic transducers, electrostatic transducers, and piezo-electric transducers), the phase-plug with waveguides designs help linearize the response, thus making them better suited for ANC.

Since ANC headphones and earphones are generally for mobile use, low power and efficiency is important. Thus, improvements in planar magnet efficiency in previously referenced U.S. Pat. No. 9,287,029, "Magnet Arrays" will make them better suited for ANC.

FIG. 22 is a Cross-sectional View of Open-Back In-Ear Planar Magnetic Earphone Audio Device 100 with Housing (101), Planar Transducer (90), and Active Noise Control System (340).

FIG. 23 is a Cross-sectional View of Open-Back In-Ear Planar Earphone Audio Device 100 with Housing (101), Planar Transducer (90), and Active Noise Control System (340).

FIG. 24 is a Cross-sectional View of Open-Back In-Ear Planar Earphone Audio Device 100 with Housing (101), Planar Transducer (90), and Active Noise Control System (340).

FIG. 25 is a Cross-sectional View of Open-Back In-Ear Planar Magnetic Earphone Audio Device 100 with Housing (101), Planar Transducer (90), and Active Noise Control System (340).

FIG. 26 is a Cross-sectional View of Open-Back In-Ear Planar Magnetic Earphone Audio Device 100 with Housing (101), Planar Transducer (90), and Active Noise Control System (340).

FIG. 27 is a Cross-sectional View of Open-Back In-Ear Planar Magnetic Earphone Audio Device 100 with Housing (101), Planar Transducer (90), and Active Noise Control System (340).

FIG. 28 is a Cross-sectional View of Closed-Back In-Ear Planar Earphone Audio Device 100 with Housing (101), Planar Transducer (90), and Active Noise Control System (340).

FIG. 29 is a comparison chart between an electrical input signal to two different transducers at the top, and two charts at the bottom showing the SPL sound wave responses for two different types of transducers. The planar transducer at the bottom matches the great detail in the sound wave that almost exactly matches the input signal. The other signal at the bottom is the sound wave response for a voice-coil style transducer with a cone and dome. Notice the distortion with smearing of the high frequencies as one example of voice-coil-style distortion.

FIG. 30 shows a planar magnetic earphone properly inserted into an ear canal. A proper seal improves low frequency performance.

Turning now to FIG. 21, we see the similar in-ear planar magnetic ear phone with both feedback and feed-forward microphones for ANC. However, in FIG. 2, there is now an acoustically non-transparent housing 110*a*, due to a closed back. This closed back is intended to decrease the noise at certain frequencies. Because of the closed back and the varied amount of noise cancellation, the processor may need to be "tuned" or adjusted to compensate.

FIG. 22 illustrates an embodiment of the present invention with feedforward and feedback microphones for ANC. In this embodiment, the planar magnetic transducer has been replaced by an electrostatic transducer 94*a* and 96*a*, and the top housing has reverted to the acoustically transparent top housing 110. This provides the open-backed feel as described in FIG. 20. The semi-open-back may be accomplished by inserting acoustically absorptive material in the outside cavity.

FIG. 23 illustrates an embodiment of the present invention with feedforward and feedback microphones for ANC. In this embodiment, the planar magnetic transducer has been replaced by an electrostatic transducer 94*a* and 96*a*, and the top housing has reverted to the acoustically non-transparent top housing 110*a*.

FIG. 24 illustrates an embodiment of the present invention with feedforward and feedback microphones for ANC. In this embodiment, the planar magnetic transducer has been replaced by a piezoelectric transducer 94*a* and 96*a*, and the top housing has reverted to the acoustically transparent top housing 110. This provides the open-backed feel as described in FIG. 20. The semi-open-back may be accomplished by inserting acoustically absorptive material in the outside cavity.

FIG. 25 illustrates an embodiment of the present invention with feedforward and feedback microphones for ANC. In this embodiment, the planar magnetic transducer has been replaced by a piezoelectric transducer 94*a* and 96*a*, and the top housing has reverted to the acoustically non-transparent top housing 110*a*.

FIG. 26 shows an embodiment of the present invention with feedforward and feedback microphones for ANC using the original planar magnet transducer configuration with control leak openings. When the ear tip makes a good seal, then the planar magnet array configuration works very well, and yields extremely low frequencies. However, when ANC is used, especially feedback ANC, and a leak in the seal between the ear canal and the ear tip 160 occurs, it may cause the system to be unstable. To avoid this sudden destabilization, controlled leaks may be put into the bottom housing. This causes a slight loss of very low frequencies, but it stabilizes the system.

Returning to FIG. 26, control leak openings have been introduced to stabilize the system with ANC. In one embodiment of the present invention, control leaks may be made in the bottom housing 115 from the outside air to inside the sound port. This also relieves some pressure into the ear.

In FIG. 27, control leak openings have been introduced. These control leaks are far up the bottom housing 115 to just below the diaphragm 94. The final position of the holes is chosen to achieve the best sound performance and the most effective noise canceling. This may variy for different types of earphones.

FIG. 28 demonstrates the application of ANC in a planar magnetic headphone with an open back. In this case, the ANC causes effective external noise reduction while still preserving the sensation of an open space, thus avoiding the unnatural occlusion effect of closed-back earphones or headphones.

For larger circumaural or supra-aural designs, the larger size of the planar drivers may comprise multiple feedback and feed-forward microphones. These may be combined with processors or multi-processors whose inputs may be summed in a weighted fashion to achieve highly accurate estimates of error signals, thus improving noise cancellation.

FIG. 28 demonstrates the application of ANC in a planar magnetic headphone, but with a closed back. The result of this is excellent noise cancellation with the benefit of high quality music reproduction provided by planar magnetic technology.

FIG. 28 demonstrates the application of ANC in an electrostatic headphone with an open back. In this case, the ANC causes effective external noise reduction while still preserving the sensation of an open space, thus avoiding the unnatural occlusion effect of closed-back electrostatic earphones or headphones.

FIG. 28 demonstrates the application of ANC in an electrostatic headphone, but with a closed back. The result of this is excellent noise cancellation with the benefit of high quality music reproduction provided by electrostatic technology.

FIG. 28 demonstrates the application of ANC in a piezoelectric headphone with an open back. In this case, the ANC causes effective external noise reduction while still preserving the sensation of an open space, thus avoiding the unnatural occlusion effect of closed-back piezoelectric earphones or headphones.

FIG. 28 demonstrates the application of ANC in a piezoelectric headphone, but with a closed back. The result of this is excellent noise cancellation with the benefit of high quality music reproduction provided by piezoelectric technology.

FIG. 28 shows the similar configuration, but without the planar transducers. Here a dynamic driver with an open back is introduced instead of the previous planar drivers. In this case, the ANC causes effective external noise reduction while still preserving the sensation of an open space, thus avoiding the unnatural occlusion effect of closed-back dynamic driver earphones or headphones.

FIG. 30 is a cross-section illustrative example of the present invention being inserted properly in an ear with ANC. A proper seal is very important for good low frequency performance.

The present invention may further comprise method patents comprising the steps of actively and passively cancelling noise in planar transducer headphone and earphone technologies.

The present invention may also comprise system patents comprising systems of actively and passively cancelling noise in planar transducer headphone and earphone technologies.

The foregoing descriptions of embodiments of the present invention have been provided for purposes of illustration and description. It is not intended to be exhaustive or to limit the invention to the precise forms disclosed. Various additional modifications of the described embodiments of the invention specifically illustrated and described herein will be apparent to those skilled in in the art, particularly in light of the teachings of this invention. It is intended that the invention cover all modifications and embodiments, which fall within the spirit and scope of the invention. Thus, while embodiments of the present invention have been disclosed, it will be understood that these are not limited to the description herein but may be otherwise modified based upon this invention.

Present embodiments satisfy the above described needs and provide further related advantages.

The foregoing descriptions of embodiments of the present invention have been provided for purposes of illustration and description. It is not intended to be exhaustive or to limit the invention to the precise forms disclosed. Various additional modifications of the described embodiments specifically illustrated and described herein will be apparent to those skilled in in the art, particularly in light of the teachings of this invention. It is intended that the invention cover all modifications and embodiments, which fall within the spirit and scope. Thus, while embodiments of the present invention have been disclosed, it will be understood that these are not limited to the description herein but may be otherwise modified based upon this invention.

I claim:

1. An audio device comprising:
- an active noise control (ANC) system including an input for receiving an audio source signal, at least one microphone input for receiving microphone signals, and an output for providing a corrected audio signal;
- at least one microphone connected to the at least one microphone input; and
- a transducer including an input for receiving the corrected audio signal from the ANC system and an output for providing output sound waves, such that the transducer is a non-voice-coil transducer, and wherein the transducer further comprises
  - a diaphragm including an electro-mechanical system for converting the input into the output for providing sound waves, and
  - a mechano-electrical system coupled to the diaphragm having a mechano-electrical output such that motion of sound waves impacting the diaphragm generates a proportionate mechano-electrical output signal, wherein the mechano-electrical system acts as the at least one microphone connected to the at least one microphone input.

2. The audio device of claim 1 wherein the transducer is a non-cone transducer.

3. The audio device of claim 1 wherein the transducer is a planar transducer.

4. The audio device of claim 1 wherein the transducer is a planar magnetic transducer.

5. The audio device of claim 1 wherein the diaphragm comprises a single diaphragm having a trace pattern with two separate circuits, the diaphragm being disposed in a magnetic field, where the two separate circuits comprise
- an input circuit disposed on the diaphragm being operative for an input signal from an audio amplifier such that the amplifier current flows through the input circuit trace pattern in the magnetic field which causes the diaphragm to vibrate at audio frequencies in accordance with the input signal, and
- an output circuit for an output signal generated from the vibrations of the output traces disposed on the diaphragm in the same magnetic field.

6. The audio device of claim 1 wherein the audio device is a hybrid feedforward-feedback audio device, such that
the at least one microphone is a feed forward microphone, and
the at least one microphone input is a feed forward microphone input.

7. The audio device of claim 1 wherein the active noise control system includes an adaptive noise cancellation system.

8. The audio device of claim 1 wherein the active noise control system includes an analog or digital control system.

9. An audio device comprising:
an active noise control (ANC) system including an input for receiving an audio source signal, at least one microphone input for receiving microphone signals, and an output for providing a corrected audio signal;
at least one microphone connected to the at least one microphone input;
a transducer including an input for receiving the corrected audio signal from the ANC system and an output for providing output sound waves,
such that the transducer is a non-voice-coil transducer; and
a housing having:
a proximal acoustic opening configured for positioning proximal to an ear, and
a distal surface located distally from the proximal acoustic opening,
wherein the non-voice-coil transducer is disposed in the housing such that the non-voice-coil transducer divides the housing into
a proximal cavity between the non-voice-coil transducer and the proximal acoustic opening, and
a distal cavity between the non-voice-coil transducer and the distal surface, and
at least one microphone disposed in the housing.

10. The audio device of claim 9 such that the proximal cavity includes at least one feedback microphone.

11. The audio device of claim 9 such that the distal cavity includes at least one feed-forward microphone.

12. The audio device of claim 9 such that the distal surface is configured with at least two acoustically transparent openings.

13. The audio device of claim 9 such that the distal cavity contains acoustically absorbent material.

14. The audio device of claim 9 such that the non-voice-coil transducer comprises a planar magnetic transducer.

15. The audio device of claim 9 such that the non-voice-coil transducer comprises an electro-static transducer.

16. The audio device of claim 9 such that the non-voice-coil transducer comprises a piezo-electric transducer.

17. An audio device comprising:
an active noise control (ANC) system including an input for receiving an audio source signal, at least one microphone input for receiving microphone signals, and an output for providing a corrected audio signal;
at least one microphone connected to the at least one microphone input,
a transducer including an input for receiving the corrected audio signal from the ANC system and an output for providing output sound waves,
such that the transducer is a planar transducer;
a housing having
a proximal acoustic opening configured for positioning in an ear canal, and
a distal surface located distally from the proximal acoustic opening,
the planar transducer disposed in the housing such that the planar transducer divides the housing into
a proximal cavity between the planar transducer and the proximal acoustic opening, and
a distal cavity between the planar transducer and the distal surface; and
at least one microphone disposed in the housing.

18. The audio device of claim 17 such that the proximal cavity includes at least one feedback microphone.

19. The audio device of claim 17 such that the proximal cavity includes a phase plug.

20. The audio device of claim 19 such that the phase plug includes the at least one feedback microphone.

21. The audio device of claim 20 such that the at least one feedback microphone included in the phase plug has an internal microphone opening leading toward the proximal acoustic opening.

22. The audio device of claim 21 such that the internal microphone opening acts as a waveguide toward the proximal acoustic opening.

23. The audio device of claim 17 such that the distal cavity includes at least one feed-forward microphone.

24. The audio device of claim 17 such that the distal surface is configured with at least one acoustically transparent opening.

25. The audio device of claim 17 such that the planar transducer includes a planar magnetic transducer.

26. The audio device of claim 17 such that the planar transducer includes an electro-static transducer.

27. The audio device of claim 17 such that the planar transducer includes a piezo-electric transducer.

* * * * *